(12) United States Patent
Simon et al.

(10) Patent No.: US 9,225,565 B2
(45) Date of Patent: Dec. 29, 2015

(54) DEVICE FOR GENERATING A VECTOR-MODULATED OUTPUT SIGNAL AND METHOD FOR GENERATING A VECTOR-MODULATED OUTPUT SIGNAL

(71) Applicant: Intel Mobile Communications GmbH, Neubiberg (DE)

(72) Inventors: Martin Simon, Otterfing (DE); Hans Geltinter, Schliersee (DE)

(73) Assignee: Intel Deutschland GmbH, Neubiberg (DE)

( * ) Notice: Subject to any disclaimer, the term of this patent is extended or adjusted under 35 U.S.C. 154(b) by 45 days.

(21) Appl. No.: 13/834,736

(22) Filed: Mar. 15, 2013

(65) Prior Publication Data

US 2013/0259152 A1     Oct. 3, 2013

Related U.S. Application Data

(60) Provisional application No. 61/613,102, filed on Mar. 20, 2012.

(30) Foreign Application Priority Data

| Mar. 20, 2012 | (DE) | 10 2012 204 448 |
| Mar. 20, 2012 | (DE) | 10 2012 204 450 |
| Mar. 20, 2012 | (DE) | 10 2012 204 451 |

(51) Int. Cl.
*H04L 27/00* (2006.01)
*H04L 25/02* (2006.01)
(Continued)

(52) U.S. Cl.
CPC ............ *H04L 27/00* (2013.01); *H04L 25/0282* (2013.01); *H04L 27/20* (2013.01); *H04B 1/0475* (2013.01); *H04B 1/30* (2013.01)

(58) Field of Classification Search
CPC ................................. H04B 1/0475; H04B 1/30
See application file for complete search history.

(56) References Cited

U.S. PATENT DOCUMENTS

| 4,399,557 A | 8/1983 | Muszkiewicz |
| 4,972,440 A | 11/1990 | Ernst et al. |

(Continued)

FOREIGN PATENT DOCUMENTS

| CN | 102158211 A | 8/2011 |
| EP | 233950 A1 | 9/1987 |

OTHER PUBLICATIONS

Alavi, M.S.; Staszewski, R.B.; De Vreede, L. C N; Long, J.R., "Orthogonal summing and power combining network in a 65-nm all-digital RF I/Q modulator," Radio-Frequency Integration Technology (RFIT), 2011 IEEE International Symposium on Radio-Frequency Integration Technology, pp. 21,24, Nov. 30, 2011-Dec. 2, 2011.4 Pages.*

(Continued)

*Primary Examiner* — Kenneth Lam
*Assistant Examiner* — Ross Varndell
(74) *Attorney, Agent, or Firm* — Eschweiler & Associates, LLC

(57) ABSTRACT

A device for generating a vector-modulated output signal based on a baseband signal having an in-phase component and a quadrature component, a first LO signal for the in-phase component of the baseband signal and a second LO signal for the quadrature component of the baseband signal comprises a baseband combination circuit, which is configured to combine the in-phase component and the quadrature component in order to obtain a plurality of combined IQ signals. Furthermore, the device includes a plurality of mixer cells for generating the vector-modulated output signal, based on the combined IQ signals, the first LO signal and the second LO signal.

19 Claims, 21 Drawing Sheets

(51) Int. Cl.
*H04L 27/20* (2006.01)
*H04B 1/04* (2006.01)
*H04B 1/30* (2006.01)

(56) References Cited

U.S. PATENT DOCUMENTS

| | | | |
|---|---|---|---|
| 5,323,356 A | 6/1994 | Okunaga | |
| 5,751,142 A | 5/1998 | Dosho et al. | |
| 5,781,035 A | 7/1998 | Tashibu | |
| 5,847,623 A | 12/1998 | Hadjichristos | |
| 5,939,931 A | 8/1999 | Noro | |
| 6,014,329 A | 1/2000 | Akaogi et al. | |
| 6,046,551 A | 4/2000 | Kita | |
| 6,058,292 A | 5/2000 | Terreault | |
| 6,259,901 B1 | 7/2001 | Shinomiya et al. | |
| 6,546,044 B1 * | 4/2003 | Dent | 375/216 |
| 6,774,683 B2 | 8/2004 | Schafferer | |
| 6,865,382 B2 | 3/2005 | Behzad | |
| 7,038,487 B2 | 5/2006 | Ingino et al. | |
| 7,176,910 B2 | 2/2007 | Tsuchi | |
| 7,233,165 B2 | 6/2007 | Jordy | |
| 7,248,115 B2 | 7/2007 | Nishimura | |
| 7,304,517 B2 | 12/2007 | Kim et al. | |
| 7,345,932 B2 | 3/2008 | Pan | |
| 7,457,606 B2 | 11/2008 | Kim | |
| 7,460,612 B2 * | 12/2008 | Eliezer et al. | 375/295 |
| 7,471,107 B1 | 12/2008 | Fortin et al. | |
| 7,609,779 B2 | 10/2009 | Wagh et al. | |
| 7,616,030 B2 | 11/2009 | Lee | |
| 7,808,841 B2 | 10/2010 | Choi et al. | |
| 8,159,301 B1 | 4/2012 | Duffy et al. | |
| 8,179,109 B2 | 5/2012 | Tang et al. | |
| 8,185,067 B2 | 5/2012 | Mattisson et al. | |
| 8,331,875 B2 | 12/2012 | Hosoya | |
| 8,565,344 B2 | 10/2013 | Kitamura et al. | |
| 8,620,242 B2 | 12/2013 | Mirzaei et al. | |
| 2001/0024133 A1 | 9/2001 | Killat et al. | |
| 2002/0057082 A1 | 5/2002 | Hwang | |
| 2003/0002594 A1 * | 1/2003 | Harel et al. | 375/299 |
| 2003/0054779 A1 | 3/2003 | Losser et al. | |
| 2003/0117209 A1 | 6/2003 | Tsuchiya et al. | |
| 2004/0095976 A1 | 5/2004 | Bowler et al. | |
| 2004/0155892 A1 | 8/2004 | Tsuchi | |
| 2005/0190856 A1 * | 9/2005 | Kroebel et al. | 375/296 |
| 2005/0212791 A1 | 9/2005 | Tsuchi | |
| 2006/0023518 A1 | 2/2006 | Iwata | |
| 2006/0057991 A1 | 3/2006 | Behzad et al. | |
| 2006/0170495 A1 | 8/2006 | Stephelbauer et al. | |
| 2006/0220685 A1 | 10/2006 | Jordy | |
| 2007/0004351 A1 | 1/2007 | Dekker | |
| 2007/0042728 A1 | 2/2007 | Pan | |
| 2007/0087711 A1 | 4/2007 | Pan | |
| 2007/0126500 A1 | 6/2007 | Mattisson et al. | |
| 2008/0299919 A1 | 12/2008 | Mow et al. | |
| 2009/0067278 A1 | 3/2009 | Choi et al. | |
| 2009/0130993 A1 | 5/2009 | Rofougaran et al. | |
| 2010/0188920 A1 | 7/2010 | Futatsuyama et al. | |
| 2010/0195765 A1 | 8/2010 | Lin et al. | |
| 2011/0133841 A1 | 6/2011 | Shifrin | |
| 2011/0170885 A1 | 7/2011 | Cho et al. | |
| 2011/0181264 A1 | 7/2011 | Aiura | |
| 2011/0188604 A1 | 8/2011 | Wagner | |
| 2011/0193543 A1 | 8/2011 | Nguyen | |
| 2011/0298541 A1 | 12/2011 | Shi | |
| 2012/0115426 A1 | 5/2012 | Andrys et al. | |
| 2012/0213237 A1 | 8/2012 | Mactaggart | |
| 2012/0274153 A1 | 11/2012 | Maxwell et al. | |
| 2013/0088473 A1 | 4/2013 | Tsuchi | |
| 2013/0107769 A1 | 5/2013 | Khlat et al. | |
| 2013/0127530 A1 | 5/2013 | Ni et al. | |
| 2013/0141064 A1 | 6/2013 | Kay et al. | |
| 2013/0141068 A1 | 6/2013 | Kay et al. | |
| 2013/0154737 A1 | 6/2013 | Shu | |
| 2014/0063639 A1 | 3/2014 | Dean | |

OTHER PUBLICATIONS

Notice of Allowance Dated Aug. 1, 2014 U.S. Appl. No. 13/835,693.
Office Action Dated May 30, 2014 U.S. Appl. No. 13/837,986.
U.S. Appl. No. 13/835,693, filed Mar. 15, 2013. 58 Pages.
U.S. Appl. No. 13/837,986, filed Mar. 15, 2013. 39 Pages.
Office Action Dated May 2, 2014 U.S. Appl. No. 13/835,693.
Staszewski, R.B.; Alavi, M.S., "Digital I/Q RF transmitter using time-division duplexing," Symposium on Radio-Frequency Integration Technology (RFIT), 2011 IEEE International pp. 165,168, Nov. 30, 2011-Dec. 2, 2011.4 Pages.
Final Office Action dated Dec. 1, 2014 in connection with U.S. Appl. No. 13/837,986.
Final Office Action Dated May 5, 2015 U.S. Appl. No. 13/837,986.
Notice of Allowance Dated Sep. 24, 2015 U.S. Appl. No. 13/837,986.

* cited by examiner

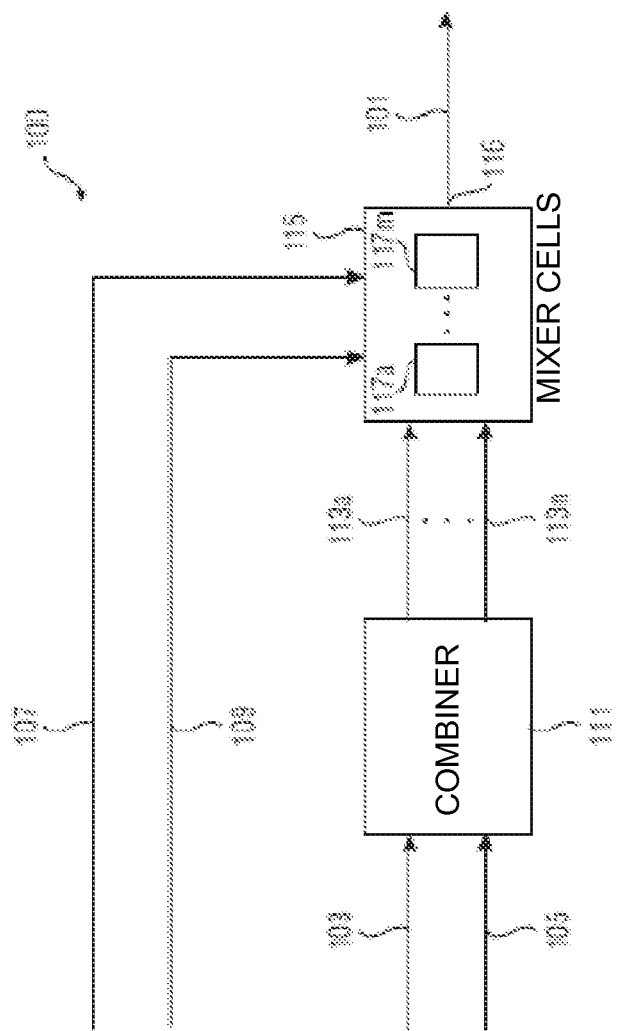

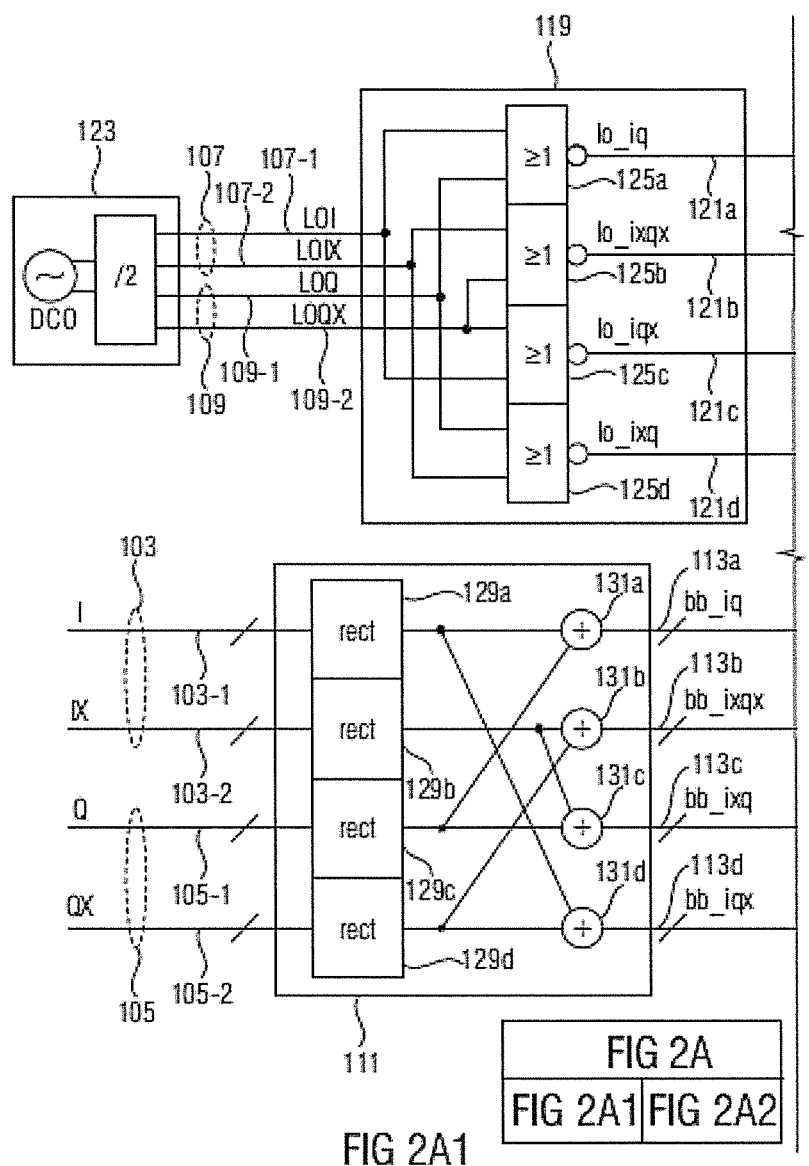

| FIG 2A1 | FIG 2A2 |

FIG 2A2

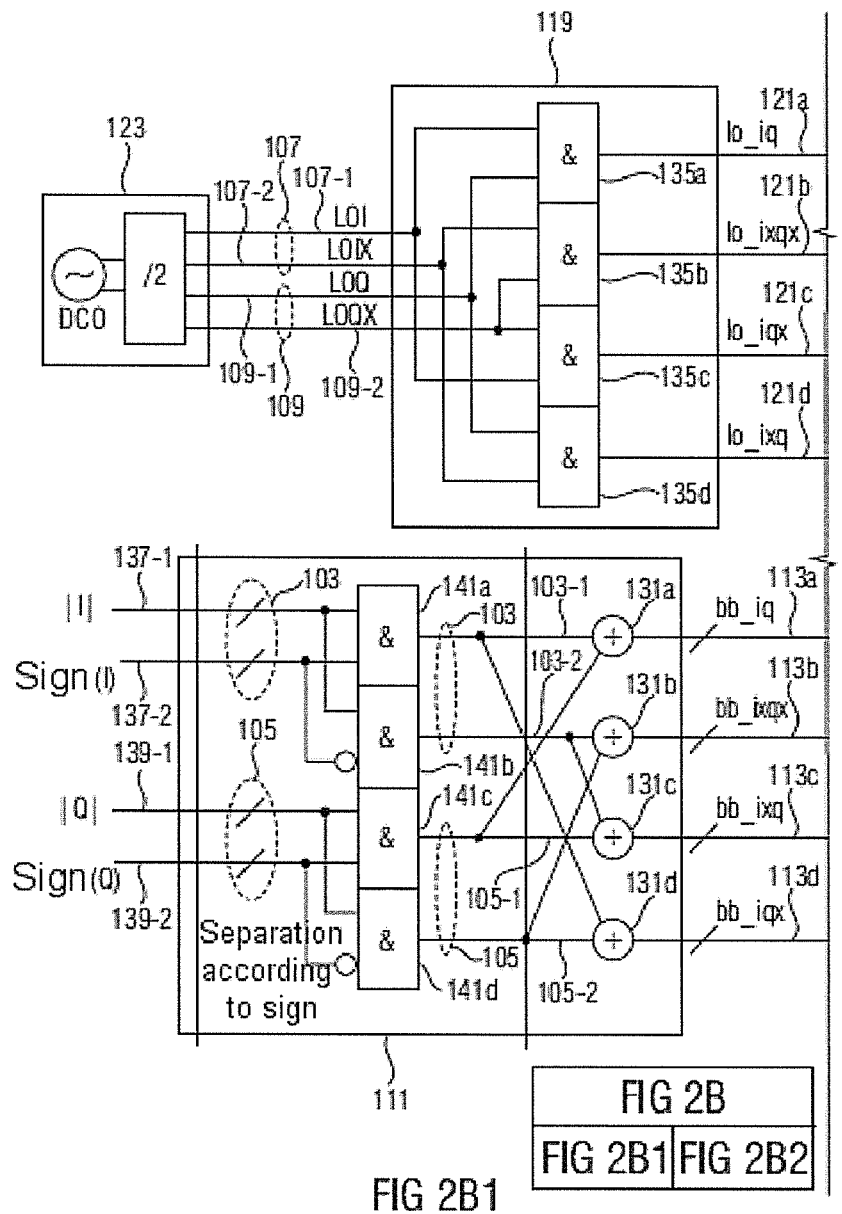

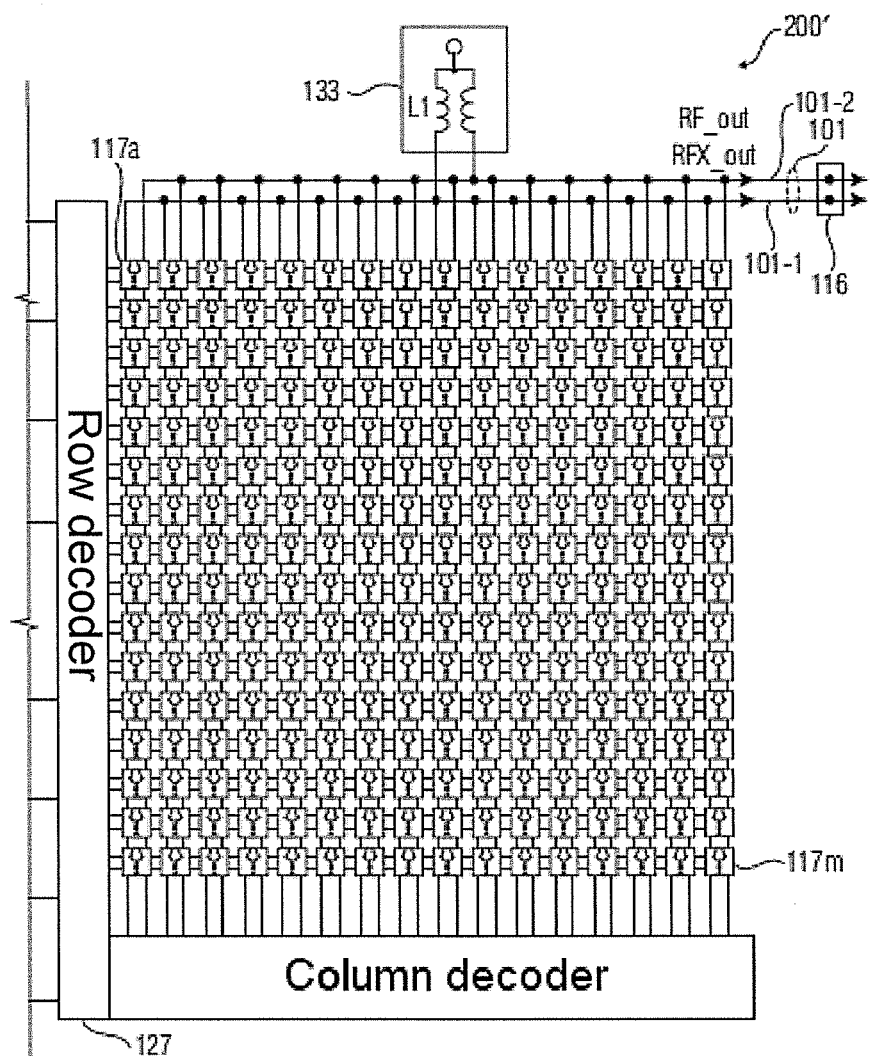
FIG 2B2

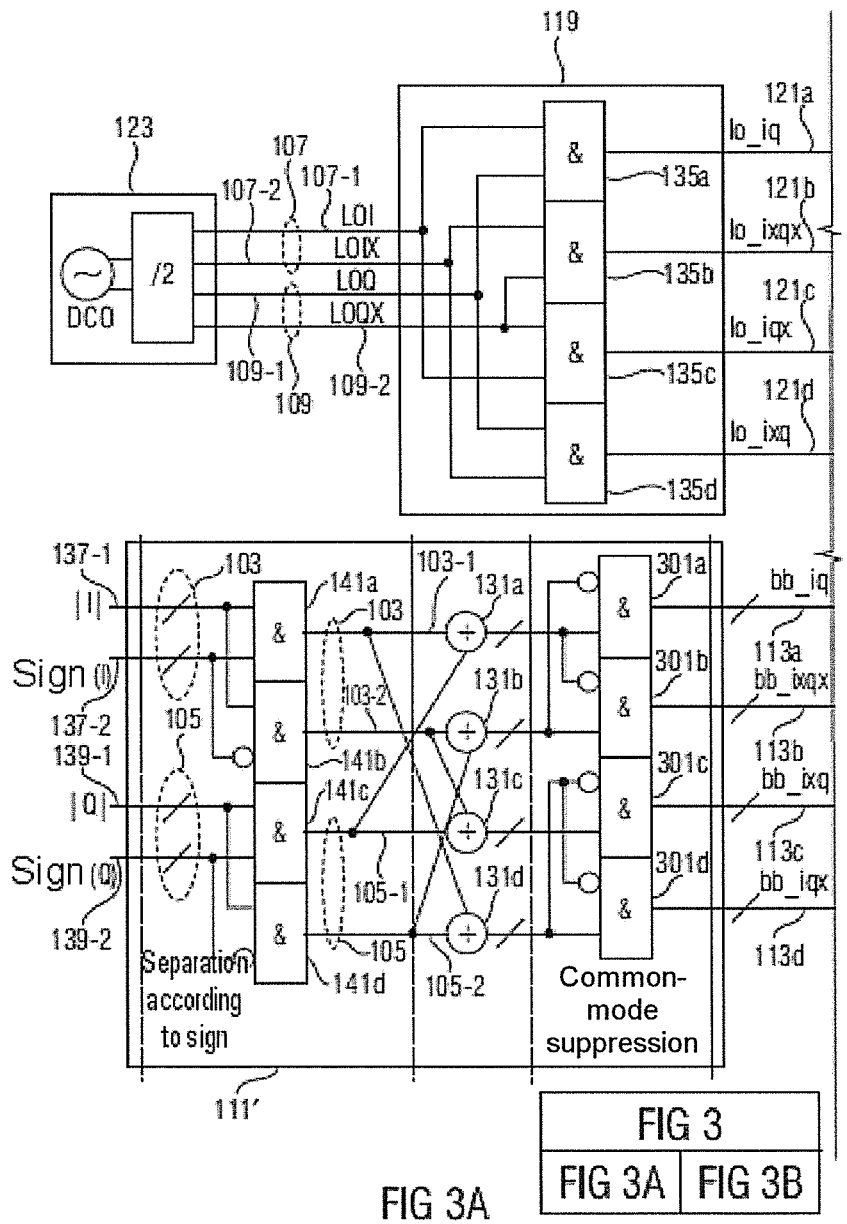

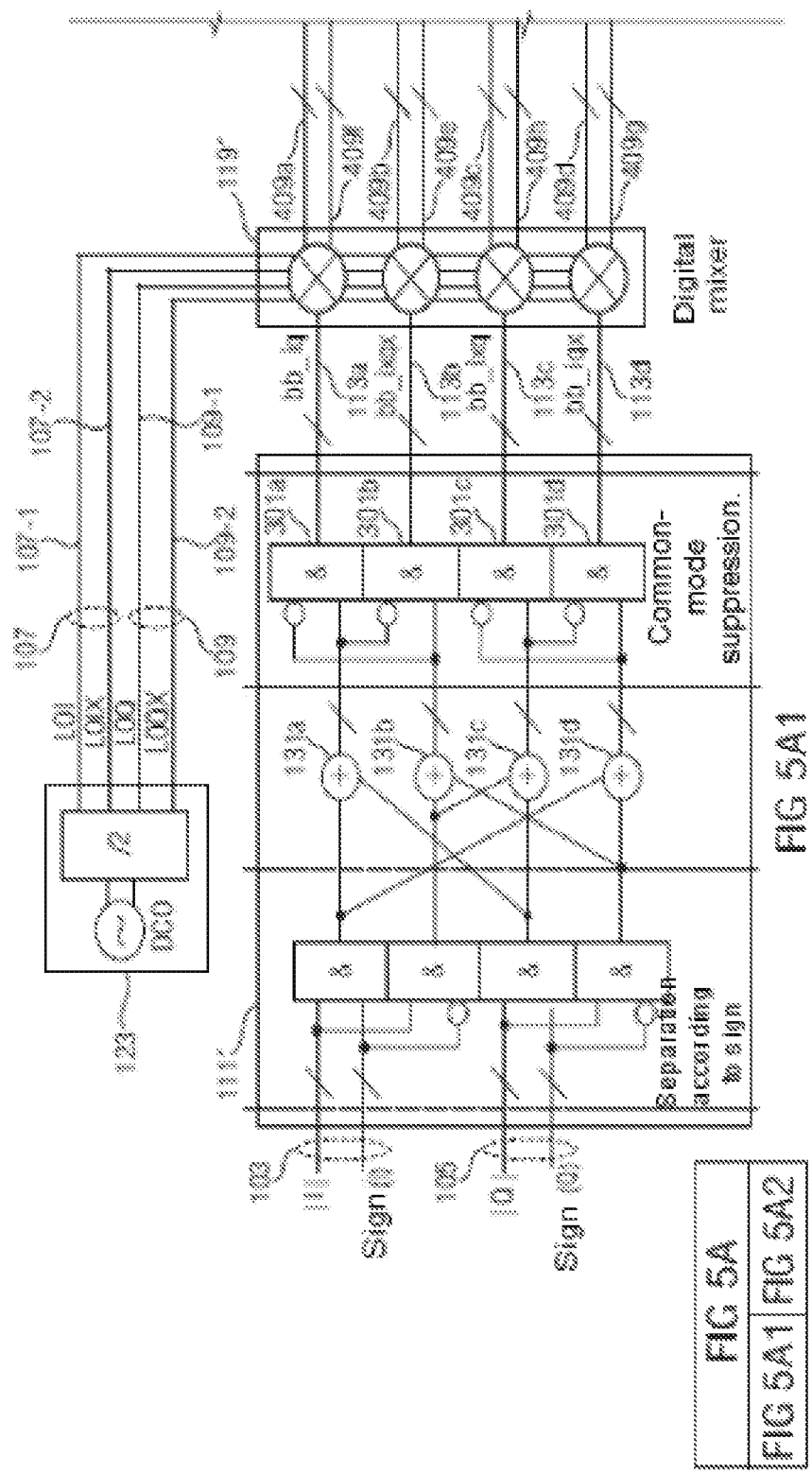

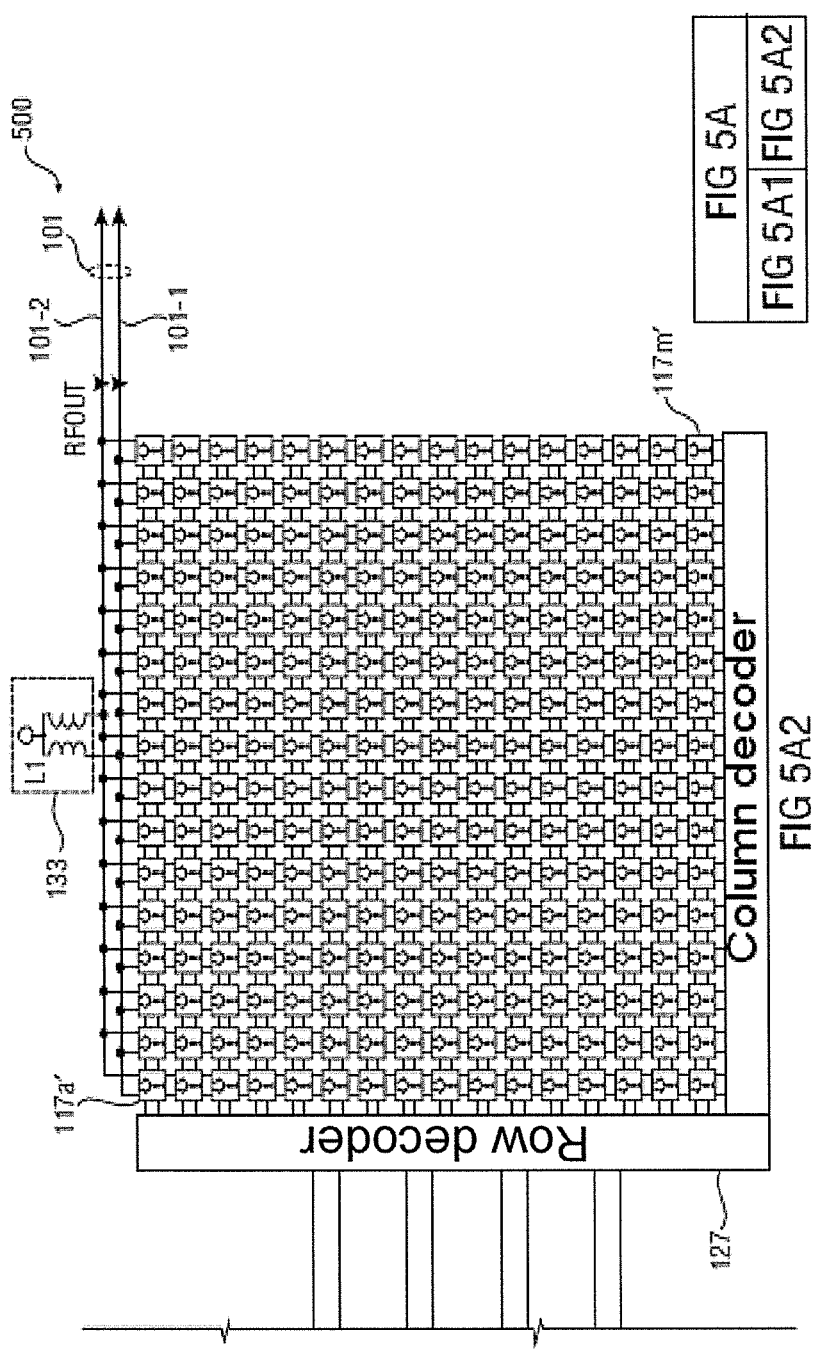

DEVICE FOR GENERATING A VECTOR-MODULATED OUTPUT SIGNAL AND METHOD FOR GENERATING A VECTOR-MODULATED OUTPUT SIGNAL

REFERENCE TO RELATED APPLICATIONS

This application claims priority to U.S. application No. 61/613,102 filed on Mar. 20, 2012, German patent application number DE 10 2012 2044 51.5 filed on Mar. 20, 2012, German patent application number DE 10 2012 2044 50.7 filed on Mar. 20, 2012, and German patent application number DE 10 2012 2044 48.5 filed on Mar. 20, 2012.

FIELD

Example embodiments of the present disclosure provide a device for generating a vector-modulated output signal based on a baseband signal having an in-phase component and a quadrature component. Further example embodiments of the present disclosure provide a method for generating such a vector-modulated output signal.

BACKGROUND

Vector modulators are used to transfer a digital quadrature baseband signal to a radio-frequency carrier. The modulated radio-frequency output signal is formed by the addition of the output signal of two doubly balanced mixers that are driven by a quadrature carrier signal.

The power efficiency of known IQ modulators or vector modulators is low since so-called common-mode signals are inherently generated during the modulation, which signals can be suppressed during the conversion of the differential signal into a single-ended signal by an RF balun at the output. The common-mode signals consume current and do not contribute to the information content of the modulated signal. In this respect, FIG. 9 shows an output signal of a vector modulator with the baseband signal I=Q, in which the common-mode signals are marked.

By way of example, 3 dB more output power can be achieved in the case of a phase offset of 90° of the modulated signal with a polar modulator for the same current consumption.

The common-mode signals also generate voltage dips on the supply voltage. The voltage dips modulate the DCO frequency (DCO=digitally controlled oscillator) of the transmitter and lead via the second harmonic to an interference signal in the output spectrum with the frequency w_lo±w_m (where w_lo is the carrier frequency and w_m is the modulation frequency).

In digital vector modulators, the operation of mixing the carrier signal with the digital baseband signal takes place in the digital driving system. The binary output word of the digital part switches a mixer array with switchable current sources. The problem of the common-mode signals furthermore also exists in digital vector modulators.

Furthermore, vector modulators have the disadvantage that the quadrature mixing in known digital vector modulators necessitates two DA converters/mixers or cell arrays (typically one cell array for an in-phase component of a baseband signal and a further cell array for a quadrature or quadrature phase component of the baseband signal). Therefore, the power efficiency is relatively low because the output power is increased only by 3 dB owing to the quadrature mixing in the case of a doubling of the output current.

SUMMARY

Therefore the present disclosure provides a concept for a more efficient vector modulator.

Example embodiments of the present disclosure provide a device for generating a vector-modulated output signal based on a baseband signal having an in-phase component and a quadrature component, a first LO signal (local oscillator signal) for the in-phase component of the baseband signal and a second LO signal for the quadrature component of the baseband signal. The device comprises a baseband combination circuit, which is configured to combine the in-phase component and the quadrature component in order to obtain a plurality of combined IQ signals.

Furthermore, the device comprises a plurality of mixer cells, which are configured to generate the vector-modulated output signal based on the combined IQ signals, the first LO signal and the second LO signal.

In accordance with further example embodiments, the device can furthermore comprise a clock combination circuit, which is configured to logically combine the first LO signal and the second LO signal in order to obtain a plurality of combined clock signals having a duty cycle of (in each case) less than 50%. The plurality of mixer cells can be configured here to generate the vector-modulated output signal based on the combined clock signals.

Further example embodiments of the present disclosure provide a device for generating a differential vector-modulated output signal based on a baseband signal having a differential in-phase component and a differential quadrature component, a first differential LO signal for the in-phase component and a second differential LO signal for the quadrature component, wherein the first differential LO signal is phase-shifted with respect to the second differential LO signal. The device comprises a clock combination circuit, which is configured to logically combine the first differential LO signal and the second differential LO signal in order to obtain a plurality of (combined) clock signals which each have a duty ratio of 25% and are shifted with respect to one another in such a way that, at every instant, apart from changeover instants, a maximum of one of the (combined) clock signals is active. Furthermore, the device comprises a baseband combination circuit, which is configured to add together subcomponents of the in-phase component and subcomponents of the quadrature component and logically combine single-bit signals resulting from the additions with one another in order to obtain a plurality of combined IQ signals each having a plurality of single-bit signals. Furthermore, the device comprises a plurality of mixer cells, which are configured to provide, based on the clock signals and the single-bit signals of the combined IQ signals, a plurality of first currents and furthermore provide a plurality of second currents in such a way that a first subcomponent of the differential vector-modulated output signal is based on a superposition of the first currents of the mixer cells and a second subcomponent of the differential vector-modulated output signal is based on a superposition of the second currents of the mixer cells. Furthermore, the baseband combination circuit is configured to carry out the logical combination of the single-bit signals resulting from the additions such that, apart from changeover instants, at every instant each mixer cell from the plurality of mixer cells provides, based on the clock signals and the single-bit signals of the combined IQ signals, maximally either a first current or a second current.

Further example embodiments of the present disclosure provide a method for generating a vector-modulated output signal.

BRIEF DESCRIPTION OF THE DRAWINGS

Example embodiments of the present disclosure are described in detail below with reference to the accompanying Figs., in which:

FIG. 1A shows a block diagram of a device in accordance with one example embodiment of the present disclosure;

FIG. 2B shows a block diagram of a vector modulator in accordance with a further example embodiment of the present disclosure;

FIG. 5A shows a block diagram of a vector modulator with common-mode suppression in accordance with a further example embodiment of the present disclosure;

FIG. 5B shows a schematic illustration of a mixer cell such as can be used in the vector modulator shown in FIG. 5a;

DETAILED DESCRIPTION

Figure 1B:
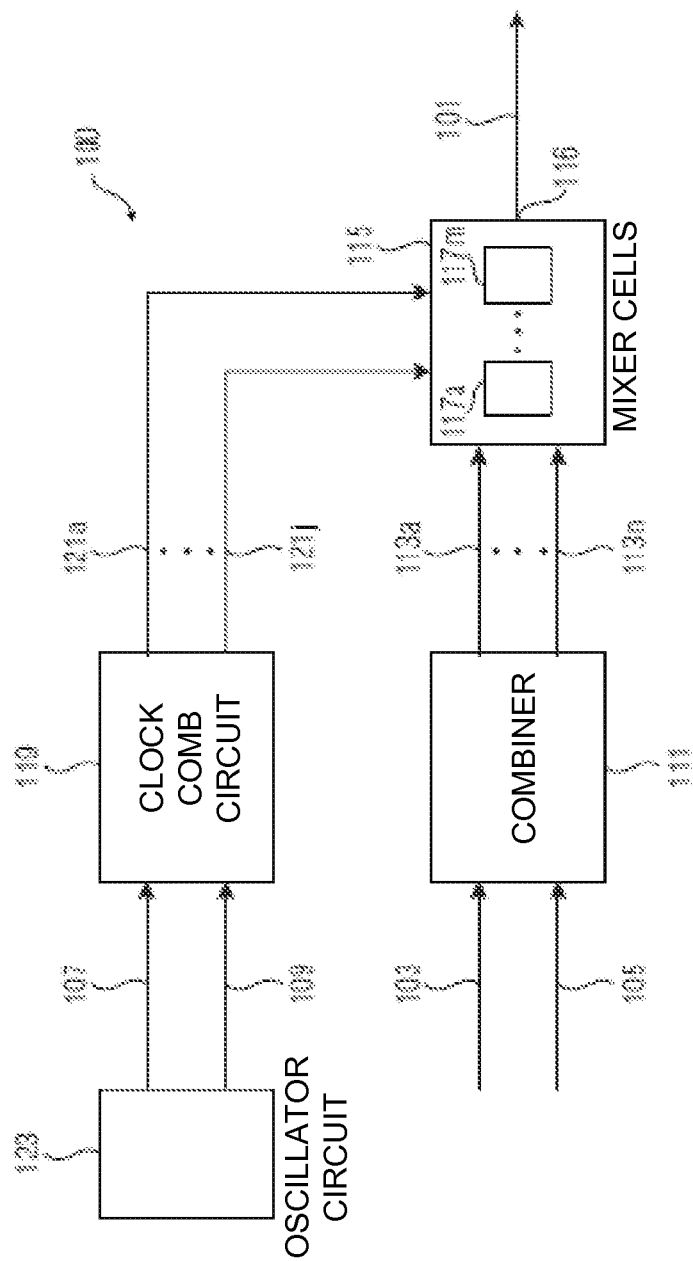
FIG. 1B shows a block diagram of a device in accordance with a further example embodiment of the present disclosure.

Before example embodiments of the present disclosure are described in detail below with reference to the accompanying Figs., it should be pointed out that elements having an identical function or identical elements are provided with the same reference signs, and that a repeated description of elements provided with the same reference signs is dispensed with. Descriptions for elements having the same reference signs are therefore mutually interchangeable.

FIG. 1A shows a device 100 for generating a vector-modulated output signal 101 on the basis of a baseband signal having an in-phase component 103 and a quadrature component 105, a first LO signal (local oscillator signal) 107 for the in-phase component 103 of the baseband signal and a second LO signal 109 for the quadrature component 105 of the baseband signal. The device 100 comprises a baseband combination circuit 111, which is configured to combine the in-phase component 103 and the quadrature component 105 in order to obtain a plurality of combined IQ signals 113a-113n. Furthermore, the device 100 comprises a plurality 115 of mixer cells 117a-117m, which are configured to generate or provide the vector-modulated output signal 101 based on the combined IQ signals 113a-113n, the first LO signal 107 and the second LO signal 109.

The device 100 can be a vector modulator, for example.

It is a concept of example embodiments of the present disclosure that a more efficient (such as, for example, more current-saving) concept can be provided for a vector modulator if the in-phase component 103 and the quadrature component 105 of a baseband signal which is intended to be modulated by means of the vector modulator or the device 100 are combined with one another and only signals resulting from this combination (the plurality of combined IQ signals 113a-113n) are provided to the mixer cells 117a-117m for generating the vector-modulated output signal 101.

In other words, in example embodiments of the present disclosure, the in-phase component 103 and the quadrature component 105 of the baseband signal are combined actually before they are provided to a mixer cell for mixing (for example with the LO signals 107, 109).

The first LO signal 107 and the second LO signal 109 can be designated as quadrature carrier signal. Example embodiments of the present disclosure can therefore be used to transfer a digital quadrature baseband signal (having the in-phase component 103 and the quadrature component 105) to a radio-frequency carrier (having the first LO signal 107 and the second LO signal 109).

In accordance with some example embodiments, the combination of the in-phase component 103 and the quadrature component 105 can be effected by means of digital combinations since a digital-to-analog conversion of the (digital) baseband signal into the (analog) vector-modulated output signal 101 is effected only in the mixer cells 117a-117m. In other words, the device 100 can be configured to receive the baseband signal having the in-phase component 103 and the quadrature component 105 as a digital signal or as digital signals, and to combine these received digital signals (by means of digital combinations) in order to obtain as a result (digital) combined IQ signals 113a-113n, on the basis of which the mixer cells 117a-117m generate the (analog) vector-modulated output signal 101.

What can be achieved by means of this combination of the in-phase component 103 with the quadrature component 105 actually before these components are fed to the mixer cells 117a-117m for mixing is that, firstly, one mixer array is sufficient for generating the vector-modulated output signal 101 (since separate mixer cells for the in-phase component 103 and the quadrature component 105 are no longer required) and, secondly, through a suitable combination of the in-phase component 103 and the quadrature component 105, a common-mode suppression can be achieved, thereby preventing common-mode signals from being switched through at an output 116 of the device 100 (at which, for example, the vector-modulated output signal 101 is provided).

In other words, example embodiments of the present disclosure, in the case of a (digital) vector modulator, by means of a (digital) logical combination or (digital) combination of the in-phase component 103 and the quadrature component 105 of the baseband signal, make it possible to suppress the inherent common-mode signals of the vector modulator. As a result, it is possible to obtain a higher efficiency and a remodulation of the DCO (digitally controlled oscillator) used is avoided. It has been recognized that, in the case of vector modulators, the disturbing common-mode signals are generated by virtue of the fact that, for specific combinations of the LO signals 107, 109 and of the in-phase component 103 and the quadrature component 105 in mixer cells of a vector modulator, a plurality of branches are turned on simultaneously, such that two currents are provided simultaneously by a mixer cell, which currents cancel one another again in the resulting output signal 101 on account of the differential configuration of such a vector modulator. By virtue of the fact that the currents cancel one another again, the currents also cannot contribute to the information content of the modulated output signal 101. Example embodiments of the present disclosure therefore make it possible, through the combination of the in-phase component 103 with the quadrature component 105, that such states do not occur in the first place in the mixer cells 117a-117m, and therefore suppress the disturbing common-mode signals. Thus, by way of example, the mixer cells 117a-117m can be configured to generate the vector-modulated output signal 101 as a differential vector-modulated output signal 101 having a first subcomponent and a second subcomponent. In this case, the differential vector-modulated output signal 101 can arise for example by the subtraction of the first subcomponent from the second subcomponent. In this case, the mixer cells 117a-117m can be configured to provide the differential vector-modulated output signal 101 such that the first subcomponent thereof is based on a superposition of a plurality of first currents of the mixer cells 117a-117m and that the second subcomponent thereof is based on a superposition of second currents of the plurality of mixer cells 117a-117m. In order to avoid common-mode signals in the vector-modulated output signal 101, the baseband combination circuit 111 can then be configured to combine the in-phase component 103 and the quadrature component 105 such that (apart from changeover instants) at every instant one or even each mixer cell 117a-117m from the plurality 115 of mixer cells 117a-117m provides maximally either a first current or a second current, for example such that at no point in time do the currents provided by a mixer cell mutually cancel one another in the differential vector-modulated output signal 101. In other words, the baseband combination circuit 111 can be configured to suppress common-mode signals that arise at the mixer cells 117a-117m even prior to the mixing in the mixer cells 117a-117m through the combination of the in-phase component 103 with the quadrature component 105. No information content in the differential vector-modulated output signal 101 is lost as a result of this process, but a current consumption of the mixer cells 117a-117m can be significantly reduced in this way.

As already explained, the combination of the in-phase component 103 with the quadrature component 105 can furthermore be used to provide the vector-modulated output signal 101 using a (common) mixer array for the in-phase component 103 and the quadrature component 105. As a result, in comparison with known vector modulators in which a dedicated mixer array is in each case used for the in-phase component and the quadrature component, half of the current sources can be saved, which makes possible a significantly more efficient implementation for a vector modulator than has been known heretofore.

This can be made possible, for example, by means of skilful driving of the mixer cells 117a-117m.

Thus, the device 100 can comprise, for example, an additional clock combination circuit, which is configured to logically combine the first LO signal and the second LO signal in order to generate suitable clock signals for the mixer cells 117a-117m.

FIG. 1B shows in this respect the device 100 from FIG. 1A additionally extended by such a clock combination circuit 119. The clock combination circuit 119 is configured to logically combine the first LO signal 107 and the second LO signal 109 in order to obtain a plurality of (combined) clock signals 121a-121j having a duty cycle of less than 50%. Furthermore, the mixer cells 117a-117m are configured to generate the vector-modulated output signal 101 based on the combined IQ signals 113a-113n and the clock signals 121a-121j. It has been discovered that a common mixer cell array can be used for the in-phase component 103 and for the quadrature component 105 if the mixer cells 117a-117m are driven with clock signals 121a-121j which (each) have a duty cycle of less than 50%. This makes it possible that, with each individual combined IQ signal 113a-113n, a respective quadrant is released in the constellation diagram for baseband in order to provide the vector-modulated output signal 101.

Thus, by way of example, the clock combination circuit 119 can be configured to provide the clock signals 121a-121j such that the latter (within a tolerance range of ±1%, ±5% or ±10% of a period of one of said clock signals 121a-121j) each have a duty cycle of 25%. In other words, a clock signal 121a-121j can be active (for example logic 1) for 25% and non-active (for example logic 0) for the remaining 75% within a period.

Furthermore, the clock combination circuit 119 can be configured to provide the clock signals 121a-121j such that the latter are phase-shifted with respect to one another, to be precise such that (apart from changeover instants) at every instant a maximum of one of the clock signals 121a-121j is active. In other words, in example embodiments of the present disclosure, the mixer cells 117a-117m can be driven with the plurality of clock signals 121a-121j such that (apart from changeover instants) at every instant a maximum of one clock signal 121a-121j is ever active. As a result, in particular in comparison with systems in which the mixer cells are driven with clock signals having a duty cycle of 50%, it can be made possible that a single mixer cell (having a single current source) can be used both for mixing the in-phase component 103 with the respective clock signal and for mixing the quadrature component 105 with the respective clock signal. In other words, the vector modulator 100 shown in FIG. 1B, in comparison with known vector modulators, is operated with quadrature carrier signals 121a-121j having a duty cycle of 25%. That is to say that, with each individual quadrature signal, a respective quadrant is released in the constellation diagram for baseband. In accordance with some example embodiments, the first LO signal 107 can have a duty cycle of 50% and, furthermore, the second LO signal 109 can also have a duty cycle of 50%. Furthermore, the first LO signal 107 (which, after all, constitutes an LO signal for the in-phase component 103) and the second LO signal 109 (which, after all, constitutes an LO signal for the quadrature component 105) can be phase-shifted (for example by 90°) with respect to one another.

In accordance with some example embodiments, the device 100 can be configured to receive these two LO signals 107, 109, or to generate these two LO signals 107, 109, wherein the device 100 in the latter case can have an optional oscillator circuit 123, which is configured to provide the first LO signal 107 and the second LO signal 109 as described above.

The oscillator circuit 123 can be configured to provide both the first LO signal 107 and the second LO signal 109 in each case as an unmodulated signal.

In accordance with some example embodiments, the described principles of using a common mixer cell array for mixing the in-phase component 103 and the quadrature component 105 and the common-mode suppression can be implemented separately from one another, in which case what is common to both is that the in-phase component 103 is combined with the quadrature component 105 actually before these components are used for driving the mixer cells 117a-117m. Furthermore, these two principles can also be combined in a single vector modulator in order to obtain a vector modulator having maximum efficiency, i.e. minimum current consumption with maximum power.

Figure 2A:
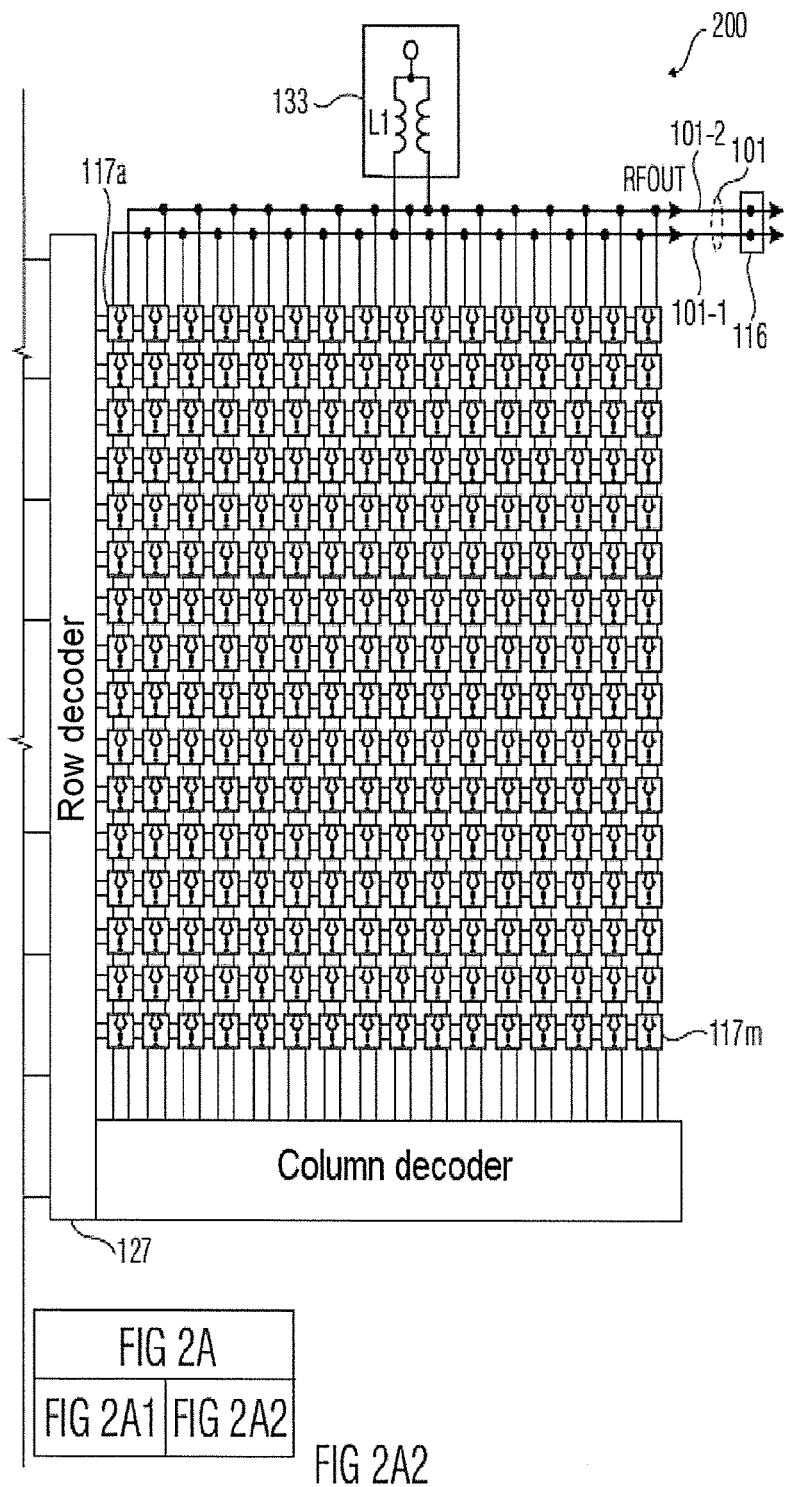
FIG. 2A shows a block diagram of a vector modulator in accordance with one example embodiment of the present disclosure.
Figure 3B:
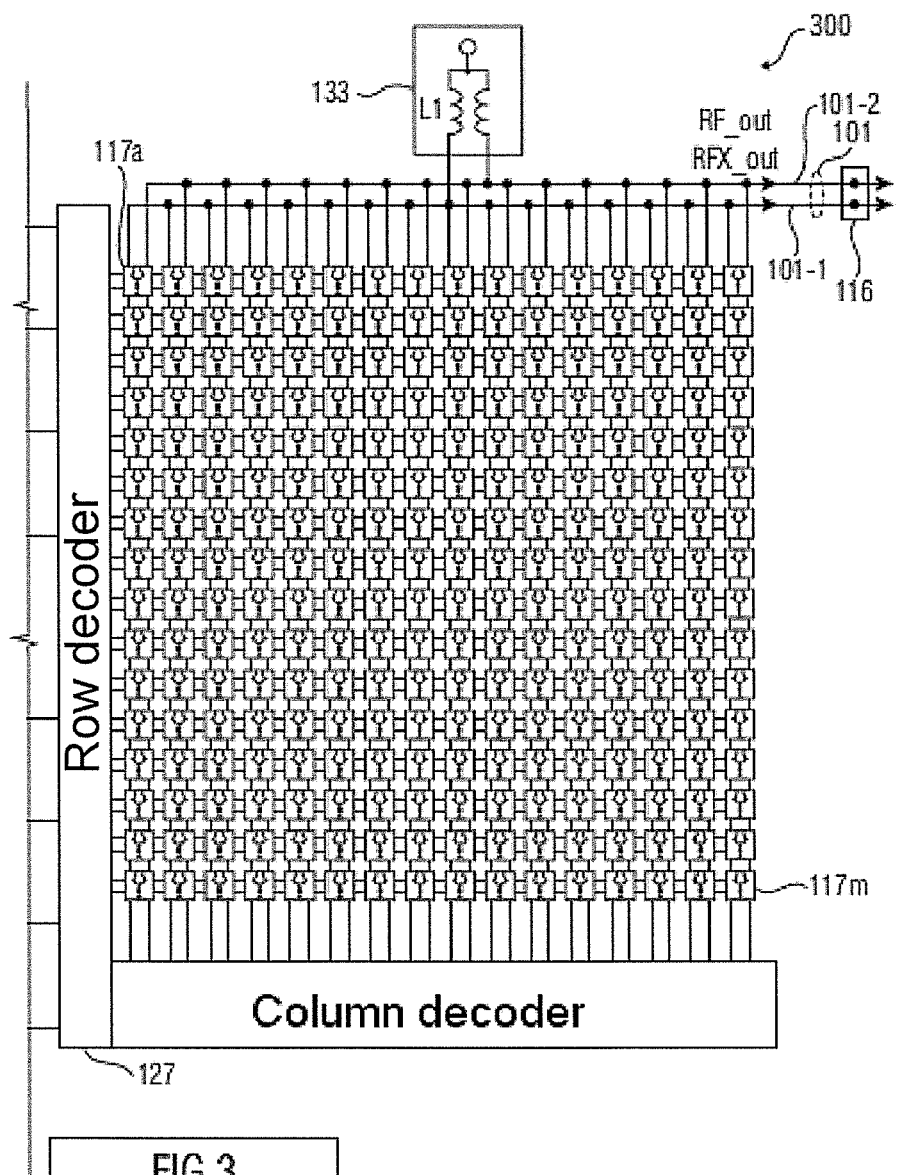
FIG. 3 shows a block diagram of a vector modulator with common-mode suppression in accordance with a further example embodiment of the present disclosure.

These two principles are described below with reference to FIGS. 2A, 2B and 3, wherein the vector modulators shown in FIGS. 2A and 2B are based on the principle of using a common mixer cell array for the in-phase component 103 and the quadrature component 105 and no common-mode suppression is effected in those vector modulators. FIG. 3 shows the vector modulator from FIG. 2B which is additionally also extended by the common-mode suppression.

Therefore, hereinafter, firstly the principle of using a common mixer cell array or of using common current sources for the in-phase component 103 and the quadrature component 105 will be explained with reference to FIGS. 2A and 2B and then the principle of common-mode suppression will be explained with reference to FIG. 3.

FIG. 2A shows a vector modulator 200 in accordance with one example embodiment of the present disclosure, which vector modulator can be, for example, an implementation of the device 100 shown in FIG. 1B.

The device 200 therefore comprises a plurality of mixer cells 117a-117m. Furthermore, the device 200 comprises the clock combination circuit 119 and the baseband combination circuit 111, wherein possible implementations of the clock combination circuit 119 and of the baseband combination circuit 111 are shown in FIG. 2A. Other implementations (for example other logic circuits) are also possible, of course, in accordance with further example embodiments.

Furthermore, the vector modulator 200 comprises the oscillator circuit 123, which, as already mentioned, is an optional part of the vector modulator 200, since the first LO signal 107 and the second LO signal 109 can also be provided by an external oscillator circuit.

As can be seen from FIG. 2A, the first LO signal 107 is a differential signal comprising a first subcomponent 107-1 (LOI) and a second subcomponent 107-2 (LOIX). Furthermore, the second LO signal 109 is also a differential signal comprising a first subcomponent 109-1 (LOQ) and a second subcomponent 109-2 (LOQX). In other words, the oscillator circuit 123 is configured to provide the first LO signal 107 as a differential signal having the first subcomponent 107-1 and the second subcomponent 107-2 and provide the second LO signal 109 as a differential signal having the first subcomponent 109-1 and the second subcomponent 109-2.

By way of example, it is possible to obtain a single-ended version (for example relative to ground) of the first LO signal 107 by subtracting the first subcomponent 107-1 of the first LO signal 107 from the second subcomponent 107-2 of the first LO signal 107. Furthermore, it is also possible to obtain a single-ended version of the second LO signal 109 by subtracting the first subcomponent 109-1 of the second LO signal 109 from the second subcomponent 109-2 of the LO signal 109.

The clock combination circuit 119 is configured to logically combine the first LO signal 107 (more precisely the subcomponents 107-1, 107-2 of the first LO signal 107) with the second LO signal 109 (more precisely with the subcomponents 109-1, 109-2 of the second LO signal 109) in order to obtain a plurality of (combined) clock signals 121a-121d. As shown in FIG. 2A, the clock combination circuit 119 can be configured to logically combine the first subcomponent 107-1 of the first LO signal 107 with the first subcomponent 109-1 of the second LO signal 109 in the context of a first logical combination 125a in order to obtain a first clock signal 121a (lo_iq). Furthermore, the clock combination circuit 119 can be configured to logically combine the second subcomponent 107-2 of the first LO signal 107 with the second subcomponent 109-2 of the second LO signal 109 in the context of a second logical combination 125b in order to obtain a second clock signal 121b (lo_ixqx). Furthermore, the clock combination circuit 119 can be configured to logically combine the first subcomponent 107-1 of the first LO signal 107 with the second subcomponent 109-2 of the second LO signal 109 in the context of a third logical combination 125c in order to obtain a third clock signal 121c (lo_iqx). Furthermore, the clock combination circuit 119 can be configured to logically combine the second subcomponent 107-2 of the first LO signal 107 with the first subcomponent 109-1 of the second LO signal 109 in the context of a fourth logical combination 125d in order to obtain a fourth clock signal 121d (lo_ixq).

In other words, the clock combination circuit 119 can be configured to logically combine each subcomponent 107-1, 107-2, 109-1, 109-2 of the LO signals 107, 109 with each subcomponent 107-1, 107-2, 109-1, 109-2 of the other LO signal 107, 109 in order to obtain the clock signals 121a-121d.

As can be seen from FIG. 2A, the logical combinations 125a-125d can in each case constitute NOR combinations (NORing). In accordance with further example embodiments, the NOR combinations 125a-125d can, however, also be replaced by AND combinations. In general, any logical combination of two subcomponents of different LO signals can be used which has the effect that a resulting (digital) output signal is only active for a (single) specific combination of (logical) signal states of the subcomponents used for this logical combination.

If, as already described above, the oscillator circuit 123 is configured to provide the first LO signal 107 and the second LO signal 109 having a duty ratio of 50% and a phase offset of 90° with respect to one another, then the (combined) clock signals 121a-121d resulting from the logical combinations 125a-125d have a duty ratio of 25%. The clock signals 121a-121d generated by the clock combination circuit 119 can be applied as clock drive signals directly to each of the plurality of mixer cells 117a-117m. By way of example, each of the plurality of mixer cells 117a-117m can be coupled to the clock combination circuit 119 in order to receive the clock signals 121a-121d generated thereby, in order to provide the vector-modulated output signal 101 based on the clock signals 121a-121d. Possible circuitry interconnections of the plurality of mixer cells 117a-117m with the clock signals 121a-121d will be described below with reference to FIGS. 4A to 4D.

In accordance with further example embodiments of the present disclosure, the vector modulator 200 or the device 200 can also comprise a decoder 127, which is configured to apply the clock signals 121a-121d to the plurality of mixer cells 117a-117m or to provide the clock signals 121a-121d for the plurality of mixer cells 117a-117m. In the case of the vector modulator 200 shown in FIG. 2A, it is possible, as already described, to use a single mixer cell array for generating the vector-modulated output signal 101. This is made possible firstly through the provision of the clock signals 121a-121d having the duty cycle of 25% and secondly through the combination of the in-phase component 103 with the quadrature component 105 by means of the baseband combination circuit 111. Since a possible implementation as to how the clock signals 121a-121d can be generated has been described above based on the clock combination circuit 119, hereinafter based on a possible implementation of the baseband combination circuit 111a description is given of how the combined IQ signals 113a-113d can be generated, such that a single mixer cell array suffices to generate the vector-modulated output signal 101.

As can be seen from FIG. 2A, the in-phase component 103 can also be a differential in-phase component 103 or have at least one differential in-phase component. Furthermore, the quadrature component 105 can also be a differential quadrature component 105 or have at least one differential quadrature component. Therefore, the in-phase component 103 can have a first subcomponent 103-1 (I) and a second subcomponent 103-2 (IX) and the quadrature component 105 can have a first subcomponent 105-1 (Q) and a second subcomponent 105-2 (QX). A single-ended version of the in-phase component 103 can be generated for example by the subtraction of the first subcomponent 103-1 thereof from the second subcomponent 103-2 thereof, and a single-ended version of the quadrature component 105 can be generated, for example, by the subtraction of the first subcomponent 105-1 thereof from the second subcomponent 105-2 thereof.

The baseband combination circuit 111 can be configured (as shown in FIG. 2A) to receive these individual subcomponents 103-1, 103-2, 105-1, 105-2 of the in-phase component 103 and of the quadrature component 105 or can be configured (as shown only with reference to FIG. 2B) to determine these individual subcomponents 103-1, 103-2, 105-1, 105-2 from the in-phase component 103 and the quadrature component 105.

The baseband combination circuit 111 can be configured to carry out a rectification (or a determination of the magnitude components) of the subcomponents 103-1, 103-2, 105-1, 105-2 of the in-phase component 103 and of the quadrature component 105 (for example by means of digital rectifiers 129a-129d). This step can be optional and can also be omitted in accordance with further example embodiments; therefore, this step will not be discussed in precise detail hereinafter. Furthermore, however, the baseband combination circuit 111 is also configured to add the subcomponent 103-1, 103-2, 105-1, 105-2 of the in-phase component 103 and of the quadrature component 105 in order to obtain the combined IQ signals 113a-113d.

In the example shown in FIG. 2A, the baseband combination circuit 111 adds each of the received digital baseband signals (or each subcomponent 103-1, 103-2, 105-1, 105-2) to the orthogonal component of the quadrature signal.

In this case, the baseband combination circuit 111 is configured to add the first subcomponent 103-1 of the in-phase component 103 to the first subcomponent 105-1 of the quadrature component 105 in the context of a first addition 131a in order to obtain a first combined IQ signal 113a (bb_iq) as a result of this first addition 131a. Furthermore, the baseband combination circuit 111 is configured to add the second subcomponent 103-2 of the in-phase component 103 to the second subcomponent 105-2 of the quadrature component 105 in the context of a second addition 131b in order to obtain a second combined IQ signal 113b (bb_ixqx) as a result of this second addition 131b. Furthermore, the baseband combination circuit 111 is configured to add the second subcomponent 103-2 of the in-phase component 103 to the first subcomponent 105-1 of the quadrature component 105 in the context of a third addition 131c in order to obtain a third combined IQ signal 113c (bb_ixq) as a result of this third addition 131c. Furthermore, the baseband combination circuit 111 is configured to add the first subcomponent 103-1 of the in-phase component 103 to the second subcomponent 105-2 of the quadrature component 105 in the context of a fourth addition 131d in order to obtain a fourth combined IQ signal 131d (bb_iqx) as a result of this fourth addition 131d.

In this case, the additions 131a-131d can be carried out with carry. Thus, by way of example, each of the subcomponents 103-1, 103-2, 105-1, 105-2 of the in-phase component 103 and of the quadrature component 105 can have a predefined bit width and, therefore, each subcomponent 103-1, 103-2, 105-1, 105-2 can also have a plurality of single-bit signals, which are also added by means of the additions 131a-131d (taking account of a possible carry). In a logically consistent manner, the resulting combined IQ signals 113a-113d then also each have a plurality of single-bit signals, which can serve for example as drive signals for the plurality of mixer cells 117a-117m or on the basis of which drive signals are generated for the mixer cells 117a-117m (for example by the decoder 127).

In other words, a single-bit signal of one of the combined IQ signals 113a-113d can form or predefine a drive signal for one mixer cell 117a-117m from the plurality of mixer cells.

A skilful choice of the driving of the plurality 117a-117m with the clock signals 121a-121d and the single-bit signals of the combined IQ signals 113a-113d makes it possible that, depending on the sign of the quadrature carrier signal, by means of the logical combinations, the sum or difference of the rectified digital quadrature baseband signals (of the subcomponents 103-1, 103-2, 105-1, 105-2 of the in-phase component 103 and of the quadrature component 105) is switched through to an RF output 116 of the vector modulator 200, at which the vector-modulated output signal 101 is provided. The modulated sideband of the RF signal (of the original carrier signal, for example the first LO signal 107) then arises at said RF output 116 of the vector modulator 200. In accordance with further example embodiments, a quadrature path of the vector modulator 200 can even be switched off, such that the plurality of mixer cells (which can form a so-called RF-DAC of the vector modulator 200) can be operated in a polar modulator mode in narrowband modulation methods. In such a polar modulator mode, the oscillator circuit 123 could furthermore be configured to provide at least the first LO signal 107 as a phase-modulated signal.

In phase-modulated methods, such as GMSK, for example, the baseband signals (the in-phase component 103 and the quadrature component 105) can be programmed to a constant value, such that the vector modulator 200 operates as an amplifier.

With the single-cell-array vector modulator 200 shown in FIG. 2A, the number of required DAC/mixer cells is halved and the current and area consumption in the chip and noise are correspondingly reduced. Furthermore, an external SAW filter can be dispensed with and, moreover, owing to the analogue signal processing being moved into the digital part, the circuit is scalable using CMO technology. In summary, FIG. 2A shows the block diagram of the vector modulator 200 with one cell array (formed from the mixer cells 117a-117m) with the logical combination of the digital baseband signals 103, 105 in the baseband combination circuit 111 and of the digital or LO signals or carrier signals 107, 109 in the clock combination circuit 119. Furthermore, other logic circuits of different types from the logic circuit shown in FIG. 2A are conceivable.

The mixer cells 117a-117m can be coupled for example to an RF balun 133 of the vector modulator 200, at which currents provided by the mixer cells 117a-117m are superposed and thus form the generated vector-modulated output signal 101. As already mentioned, logical combinations different from those shown in FIG. 2A can also be chosen in order to determine the clock signals 121a-121d and the combined IQ signals 113a-113d.

In this respect, FIG. 2B shows a vector modulator 200' in accordance with a further example embodiment of the present disclosure. The vector modulator 200' shown in FIG. 2B differs from the vector modulator 200 shown in FIG. 2A in that the clock combination circuit 119 thereof and the baseband combination circuit 111 thereof have a different implementation, the basic functions of these circuits remaining the same in the vector modulator 200 shown in FIG. 2A and in the vector modulator 200' shown in FIG. 2B.

The clock combination circuit 119 of the vector modulator 200' differs from the clock combination circuit 119 of the vector modulator 200 shown in FIG. 2A in that the logical NOR combinations 125a-125d have been replaced by logical AND combinations 135a-135d. The replacement of the NOR combinations 125a-125d by the AND combinations 135a-135d (assuming that the LO signals 107, 109 are also provided as described in FIG. 2A (that is to say with a duty ratio of 50% and a phase offset of) 90°) changes nothing about the basic principle of the clock combination circuit 119 since the clock signals 121a-121d still have a duty cycle of 25% and are phase-shifted with respect to one another in such a way that, apart from at changeover instants, at every instant a maximum of one of the clock signals 121a-121d is active.

Furthermore, the implementation of the baseband combination circuit 111 as shown in FIG. 2B differs from the implementation of the baseband combination circuit 111 as shown in FIG. 2A in that in FIG. 2B the baseband combination circuit 111 is configured to receive the in-phase component 103 in the form of a first magnitude component 137-1 and a first sign component 137-2, wherein the first magnitude component 137-1 describes a magnitude of the in-phase component 103 and the first sign component 137-2 describes a sign of the in-phase component 103. Analogously, the baseband combination circuit 111 is furthermore configured to receive the quadrature component 105 in the form of a second magnitude component 139-1 and a second sign component 139-2, wherein the second magnitude component 139-1 describes a magnitude of the quadrature component 105 and the second sign component 139-2 describes a sign of the quadrature component 105. Based on the magnitude components 137-1, 139-1 and the sign components 137-2, 139-2, the baseband combination circuit 111 can be configured to convert the in-phase component 103 and the quadrature component 105 in each case into differential components in order to obtain the first subcomponent 103-1 and the second subcomponent 103-2 of the in-phase component 103 and to obtain the first subcomponent 105-1 and the second subcomponent 105-2 of the quadrature component 105.

In this case, the baseband combination circuit 111 can be configured to logically combine the first magnitude component 137-1 with the first sign component 137-2 in the context of a first AND combination 141a in order to obtain the first subcomponent 103-1 of the in-phase component 103. Furthermore, the baseband combination circuit 111 can be configured to logically combine the first magnitude component 137-1 with a negated version of the first sign component 137-2 in the context of a second AND combination 141b in order to obtain the second subcomponent 103-2 of the in-phase component 103. Furthermore, the baseband combination circuit 111 can be configured to logically combine the second magnitude component 139-1 with the second sign component 139-2 in the context of a third AND combination 141c in order to obtain the first subcomponent 105-1 of the quadrature component 105. Furthermore, the baseband combination circuit 111 can be configured to logically combine the second magnitude component 139-1 with a negated version of the second sign component 139-2 in the context of a fourth AND combination 141d in order to obtain the second subcomponent 105-2 of the quadrature component 105. Both the magnitude components 137-1, 139-1 and the sign components 137-2, 139-2 can each have a plurality of bits or bit signals and, accordingly, the AND combinations 141a-141d can be effected at the bit level, wherein bits having the same bit significance are always logically combined with one another.

As described, what can be achieved by the combination of the LO signals 107, 109 and the in-phase component 103 and the quadrature component 105, as shown in FIGS. 2A and 2B, is that one (single) mixer cell array suffices to provide the vector-modulated output signal 101. Moreover, it has already been described initially that example embodiments of the present disclosure furthermore make it possible that, by combining the in-phase component 103 and the quadrature component 105, disturbing common-mode signals which do not contribute to the information content of the vector-modulated output signal 101 can be suppressed. This will be described hereinafter on the basis of a vector modulator 300 shown in FIG. 3. The vector modulator 300 shown in FIG. 3 is based on the vector modulator 200' in FIG. 2B and has additionally been extended by the common-mode suppression. In accordance with further example embodiments, it is also possible to carry out this common-mode suppression in the case of vector modulators which use clock signals having a duty cycle of 50%.

The vector modulator 300 shown in FIG. 3 differs from the vector modulator 200' shown in FIG. 2B in that the baseband combination circuit 111' thereof is additionally extended by the common-mode suppression relative to the baseband combination circuit 111 of the vector modulator 200'. The implementation of the baseband combination circuit 111' as shown in FIG. 3 thus constitutes a further possible implementation of the baseband combination circuit 111 shown in FIGS. 1A and 1B.

As already described, the subcomponents 103-1, 103-2, 105-1, 105-2 of the in-phase component 103 and of the quadrature component 105 can each have a plurality of single-bit signals, which are added to one another by means of the additions 131a-131d, such that a plurality of single-bit signals in each case result from said additions 131a-131d. The baseband combination circuit 111' is configured to logically combine these single-bit signals resulting from the additions 131a-131d with one another in order to obtain the combined IQ signals 113a-113d such that, if the single-bit signals thereof are used as drive signals for the mixer cells 117a-117m, no common-mode components are switched through to the output 116 of the vector modulator 300.

Thus, as already explained, the mixer cells 117a-117m can be configured to generate the vector-modulated output signal 101 as a differential vector-modulated output signal 101 having the first subcomponent 101-1 and the second subcomponent 101-2. Furthermore, the mixer cells 117a-117m can be configured to provide the differential vector-modulated output signal 101 such that the first subcomponent 101-1 thereof is based on a superposition of a plurality of first currents of the mixer cells 117a-117m and that the second subcomponent 101-2 thereof is based on a superposition of a plurality of second currents of the mixer cells 117a-117m. In order to make possible the common-mode suppression, in this case the baseband combination circuit 111' can be configured to combine the in-phase component 103 and the quadrature component 105 (by means of the additions 131a-131d and the common-mode suppression) such that (apart from changeover instants) at every instant one mixer cell 117a-117m from the plurality of mixer cells 117a-117m provides maximally either a first current or a second current, for example such that at no point in time do the currents provided by a mixer cell 117a-117m mutually cancel one another in the generated differential vector-modulated output signal 101.

As can be seen from FIG. 3, in this case the baseband combination circuit 111' can be configured to logically combine (in the context of a first AND combination 301a) the single-bit signals resulting from the first addition 131a (a first time) with the single-bit signals resulting from the second addition 131b in order to obtain the first combined IQ signal 113a, having a plurality of single-bit signals. Furthermore, the baseband combination circuit 111' can be configured to logically combine (in the context of a second AND combination 301b) the single-bit signals resulting from the first addition 131a (a second time) with the single-bit signals resulting from the second addition 131b in order to obtain the second combined IQ signal 113b, having a plurality of single-bit signals. Furthermore, the baseband combination circuit 111' can be configured to logically combine (in the context of a third AND combination 301c) the single-bit signals resulting from the third addition 131c (a first time) with the single-bit signals resulting from the fourth addition 131d in order to obtain the third combined IQ signal 113c, having a plurality of single-bit signals. Furthermore, the baseband combination circuit 111' can be configured to logically combine (in the context of a fourth AND combination 301d) the single-bit signals resulting from the third addition 131c (a second time) with the single-bit signals resulting from the fourth addition 131d in order to obtain the fourth combined IQ signal 113d, having a plurality of single-bit signals.

In this case, the baseband combination circuit 111' can be configured to logically combine or to combine with one another in the AND combinations 301a-301d only single-bit signals which result from the additions 131a-131d and which have the same bit significance. In the example shown in FIG. 3, the baseband combination circuit 111' is configured to carry out the first AND combination 301a based on non-negated versions of the bit signals resulting from the first addition 131a and negated versions of the single-bit signals resulting from the second addition 131b. Furthermore, the baseband combination circuit 111' is configured to carry out the second AND combination 301b based on negated versions of the single-bit signals resulting from the first addition 131a and non-negated versions of the single-bit signals resulting from the second addition 131b. Furthermore, the baseband combination circuit 111' is configured to carry out the third AND combination 301c based on non-negated versions of the single-bit signals resulting from the third addition 131c and negated versions of the single-bit signals resulting from the fourth addition 131d. Furthermore, the baseband combination circuit 111' is configured to carry out the fourth AND combination 301d based on negated versions of the single-bit signals resulting from the third addition 131c and non-negated versions of the single-bit signals resulting from the fourth addition 131d.

The single-bit signals of the combined IQ signals 113a-113d that are generated by the baseband combination circuit 111' can, as already explained, either be applied directly to drive inputs of the mixer cells 117a-117m, and there form, for example, drive signals for the mixer cells 117a-117m, or can be received and evaluated by the decoder 127 shown in FIG. 3, and the decoder 127 can be configured to provide drive signals for the mixer cells 117a-117m based on these received combined IQ signals 113a-113d.

To summarize, FIG. 3 shows a device 300 for generating the differential vector-modulated output signal 101 based on the baseband signal having the differential in-phase component 103 and the differential quadrature component 105, the first differential LO signal 107 for the in-phase component and the second differential LO signal 109, which is shifted with respect to the first differential LO signal 107, for the quadrature component. The device 300 comprises the clock combination circuit 119, which is configured to logically combine the first differential LO signal 107 and the second differential LO signal 109 in order to obtain the four clock signals 121a, 121b, 121c, 121d. The four clock signals 121a-121d each have (within a tolerance range of ±1%, ±5%, ±10% of a period of one of the clock signals 121a-121d) a duty ratio of 25% and are phase-shifted with respect to one another in such a way that (apart from at changeover instants) at every instant a maximum of one of the four clock signals 121a-121d is active. Furthermore, the device 300 comprises the baseband combination circuit 111', which is configured to add together subcomponents 103-1, 103-2 of the in-phase component 103 and subcomponents 105-1, 105-2 of the quadrature component 105 and to logically combine the single-bit signals resulting from the additions with one another in order to obtain the four combined IQ signals 113a-113d each having a plurality of single-bit signals 113a-1-113d-1. Furthermore, the device 300 comprises the plurality of mixer cells 117a-117m, which are configured to provide, based on the clock signals 121a-121d and the single-bit signals 113a-1-113d-1 of the combined IQ signals 113a-113d, the first currents $I_1$ and furthermore to provide the second currents $I_2$ in such a way that the first subcomponent 101-1 of the differential vector-modulated output signal 101 is based on a superposition of the first currents $I_1$ and the second subcomponent 101-2 of the differential vector-modulated output signal 101 is based on a superposition of the second currents $I_2$. Furthermore, the baseband combination circuit 111' is configured to carry out the logical combination of the single-bit signals resulting from the additions such that (apart from changeover instants), at every instant each mixer cell 117a-117m provides, based on the clock signals 121a-121d and the single-bit signals 113a-1 to 113d-1 of the combined IQ signals 113a-113d, maximally either a first current $I_1$ or a second current $I_2$.

Possible implementations for the mixer cells 117a-117m will be shown hereinafter with reference to FIGS. 4A to 4D, wherein the mixer cells presented in FIGS. 4A and 4B use the advantage of example embodiments of the present disclosure that a mixer cell with a single current source can be used to mix both the in-phase component 103 and the quadrature component 105 in order to obtain the vector-modulated output signal 101.

Figure 4A:
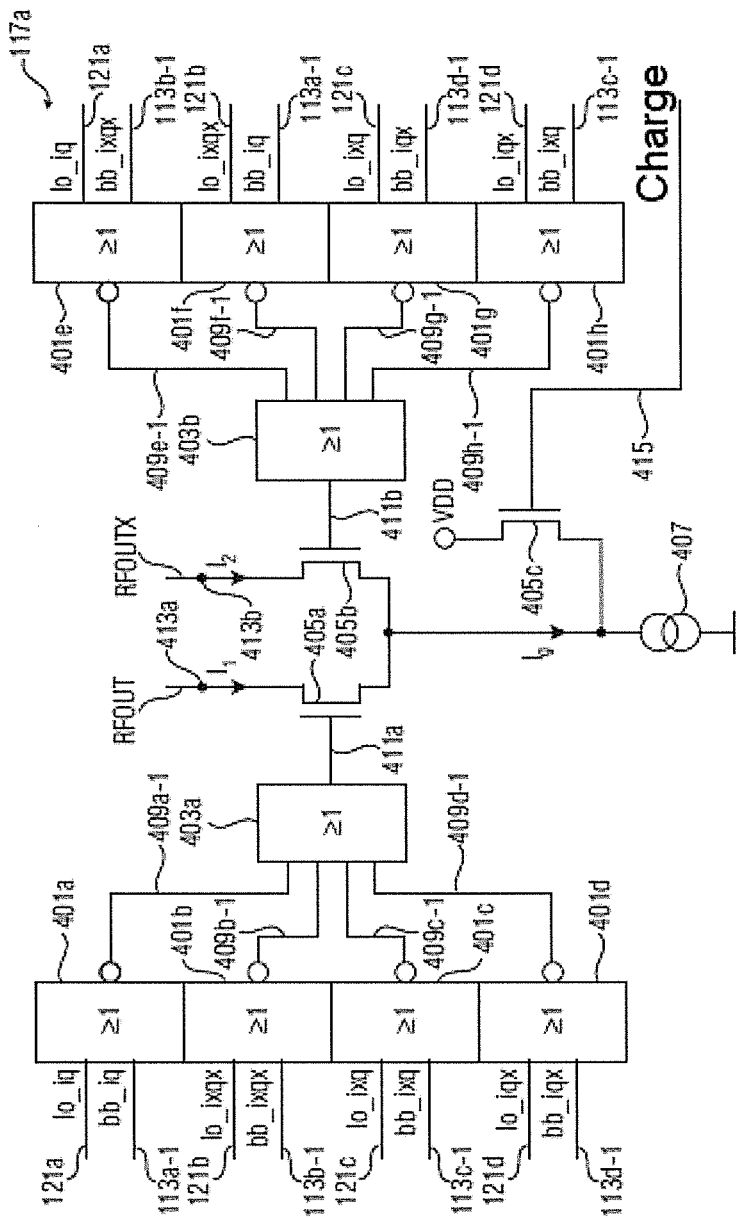
FIGS. 4A-4D show schematic illustrations of mixer cells such as can be used in example embodiments of the present disclosure.
Figure 4B:
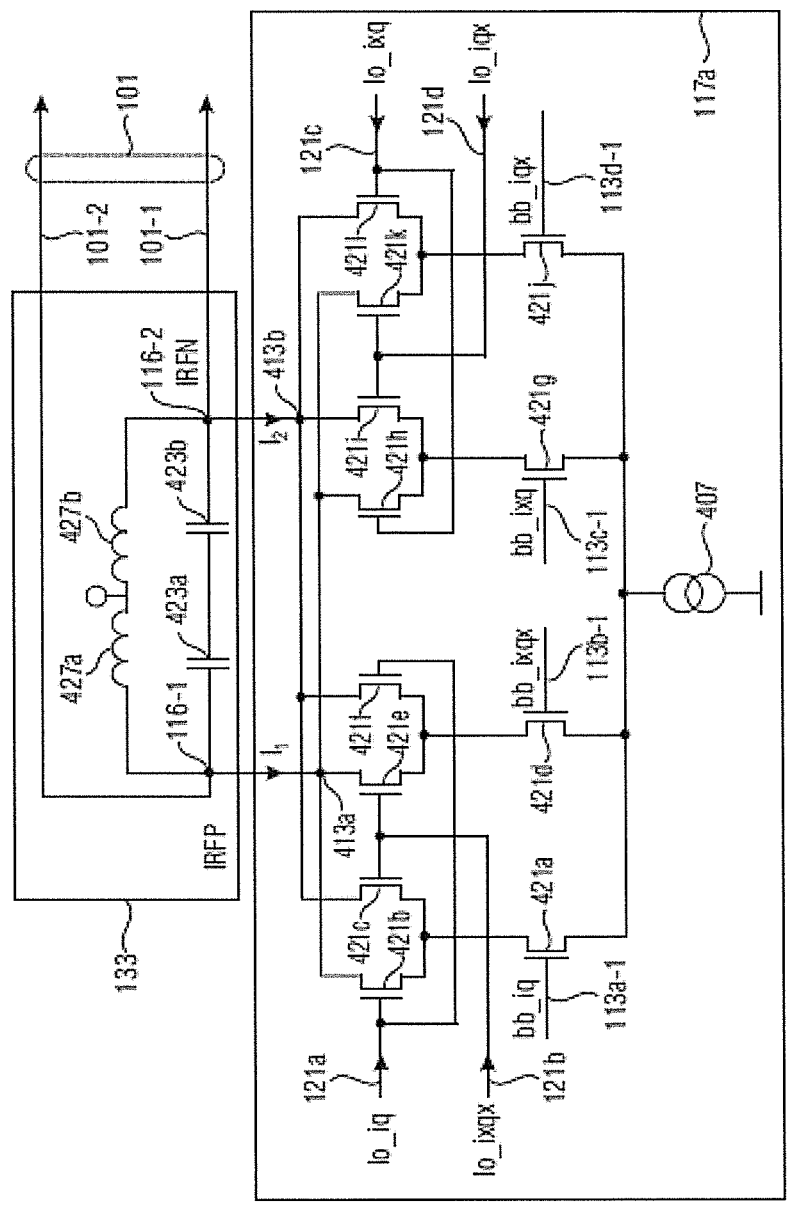
Figure 4C:
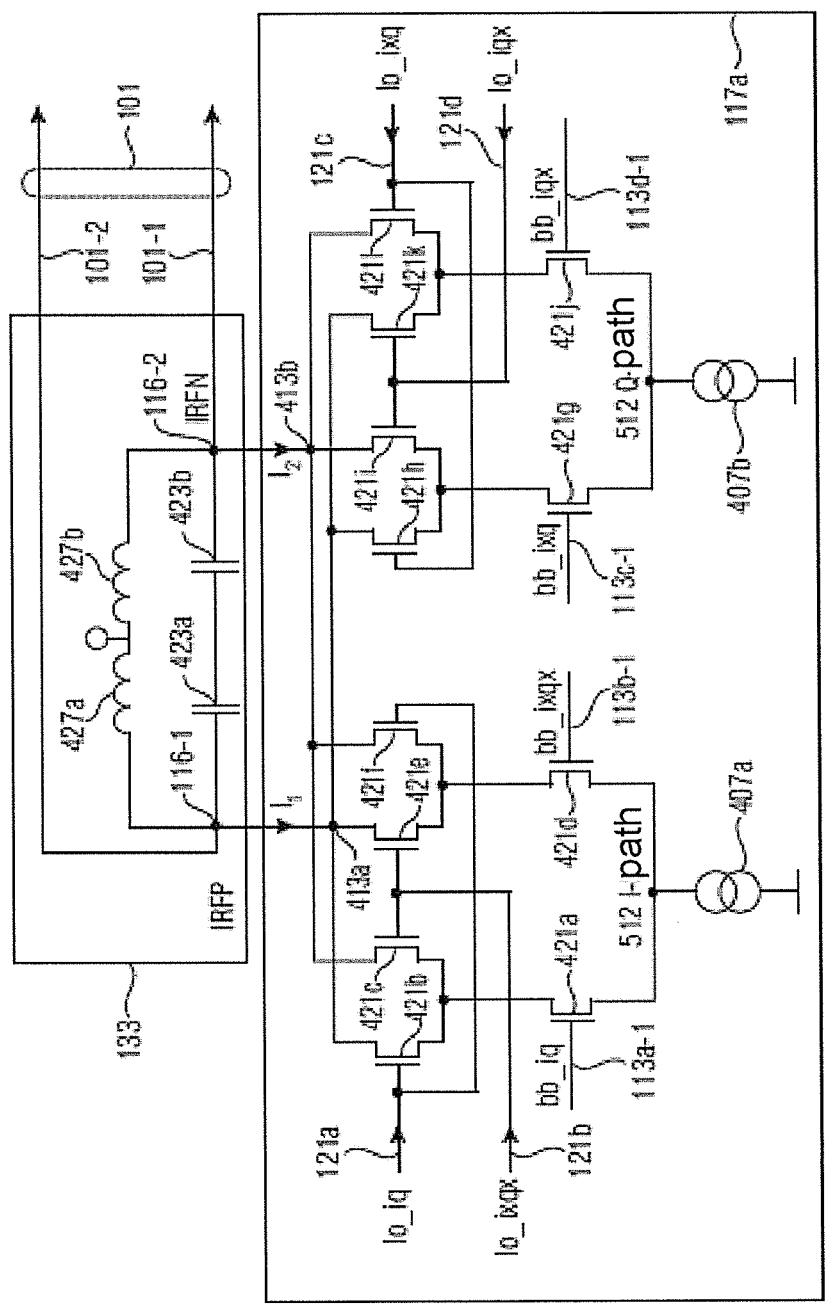
Figure 4D:
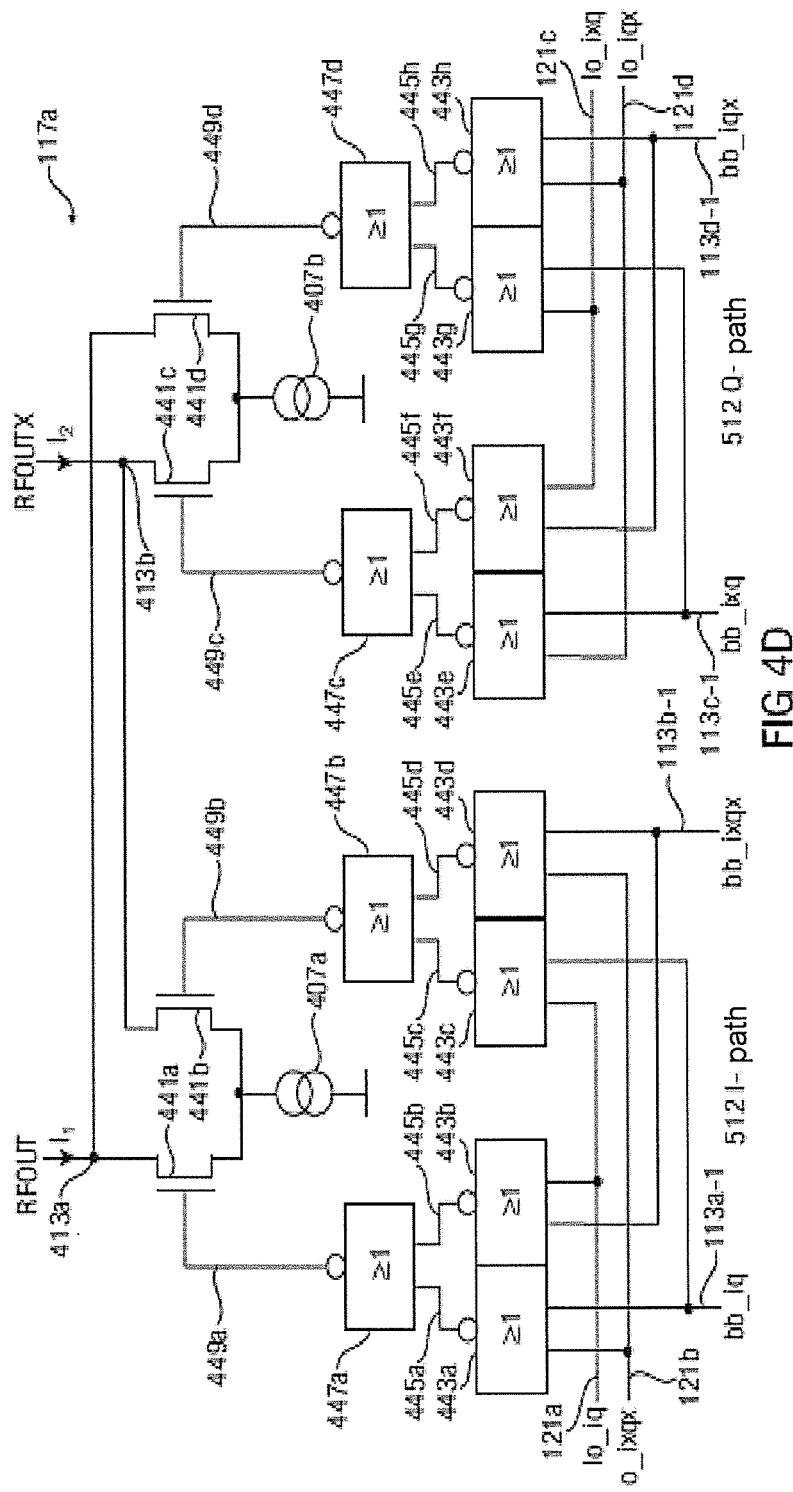

The mixer cells shown in FIGS. 4C and 4D are in each case based on the principle that two individual current sources are used, but still have the advantage that the common-mode suppression described in FIG. 3 can be used in the driving of the mixer cells.

It is assumed hereinafter for the sake of simplicity that the drive signals for the mixer cells are identical to the single-bit signals of the combined IQ signals 113a-113d that are provided by the baseband combination circuit 111 or the baseband combination circuit 111', in other words that no decoder is connected between the mixer cells 117a-117m and the baseband combination circuit 111, 111' or that the decoder 127 directly applies the single-bit signals of the combined IQ signals 113a-113d that are provided by the baseband combination circuit 111, 111' to the mixer cells 117a-117m as drive signals. Analogously thereto it is, as described, also possible, of course, for the decoder 127, based on the single-bit signals of the combined IQ signals 113a-113d to generate the drive signals for the mixer cells 117a-117m, for example based on a thermal decoder principle.

FIG. 4A shows a first possible implementation for a mixer cell 117a from the plurality of mixer cells 117a-117m such as can be used in vector modulators or devices in accordance with example embodiments of the present disclosure. Typically, the construction of the various mixer cells is identical in this case, and so only the mixer cell 117a will be described in a representative fashion.

In accordance with some example embodiments, in the plurality of mixer cells, each mixer cell 117a-117m can receive the same clock signals 121a-121d, but IQ drive signals assigned to it (which are based for example on the single-bit signals of the combined IQ signals 113a-113d or which correspond to the single-bit signals of the combined IQ signals 113a-113d).

In accordance with some example embodiments, in this case each of the mixer cells 117a-117m from the plurality of mixer cells can be configured to obtain at least one single-bit signal of each of the combined IQ signals 113a-113d provided by the baseband combination circuit 111, 111', and to (logically) combine the single-bit signal with one or more of the clock signals 121a-121d in order to obtain as a result a current source drive signal, on the basis of which a current source of the mixer cells 117a-117m is driven.

In the implementation of the mixer cell 117a as shown in FIG. 4A, the mixer cell has a first NOR combination 401a, a second NOR combination 401b, a third NOR combination 401c, a fourth NOR combination 401d, a fifth NOR combination 401e, a sixth NOR combination 401f, a seventh NOR combination 401g and an eighth NOR combination 401h. Furthermore, the mixer cell 117a has a first OR combination 403a and a second OR combination 403d. Furthermore, the mixer cell 117a has a first (switching) transistor 405a, a second (switching) transistor 405b and a third (switching) transistor 405c. Furthermore, the mixer cell 117a has a current source 407. As can be seen from FIG. 4A, the mixer cell 117a is configured to receive for each of the combined IQ signals 113a-113d a drive signal which is based on a single-bit signal of the respective combined IQ signal 113a-113d or corresponds thereto. Furthermore, the mixer cell 117a is configured to receive the (four) clock signals 121a-121d provided by the clock combination circuit 119.

It is assumed hereinafter that the drive signals correspond to the single-bit signals of the combined IQ signals 113a-113d.

The first NOR combination 401a is configured to logically combine (NOR) or to combine the first clock signal 121a with a single-bit signal 113a-1 of the first combined IQ signal in order to obtain a first clock-IQ combined signal 409a-1. Furthermore, the second NOR combination 401b is configured to logically combine (NOR) the second clock signal 121b with a first single-bit signal 113b-1 of the second combined IQ signal 113b in order to obtain a second combined clock-IQ signal 409b-1. Furthermore, the third NOR combination 401c is configured to logically combine (NOR) the third clock signal 121c with a first single-bit signal 113c-1 of the third combined IQ signal 113c in order to obtain a third combined clock-IQ signal 409c-1. Furthermore, the fourth NOR combination 401d is configured to logically combine (NOR) the fourth clock signal 121d with a first single-bit signal 113d-1 of the fourth combined IQ signal 113d in order to obtain a fourth combined clock-IQ signal 409d-1. The first OR combination 403a is configured to logically combine (OR) the four clock-IQ signals 409a-1-409d-1 in order to obtain a first current source drive signal 411a. The first transistor 405a is configured to receive the first current source drive signal 411a at its control terminal and to turn on (to put into a low-impedance state) and to turn off (to put into a high-impedance state) a path between its first terminal and its second terminal depending on the first current source drive signal 411a.

In the present application, a first terminal of a transistor can be for example a source terminal, an emitter terminal or a drain terminal. A second terminal of a transistor can be for example a drain terminal, a collector terminal or a source terminal, an emitter terminal of the transistor. A control terminal of a transistor can be for example a gate terminal or a base terminal of the transistor. A switching path of a transistor can be for example a drain-source path of the transistor or can be an emitter-collector path of the transistor. A main transistor current then typically flows from the first terminal of the transistor to the second terminal of the transistor. Furthermore, a switching path of the transistor can be put into a low-impedance state (turned on) or a high-impedance state (turned off) depending on a voltage at the control terminal of the transistor.

The first terminal of the first transistor 405a is coupled to a first terminal of the current source 407, at which the current source 407a provides or impresses a total current $I_g$ of the current source. While the first terminal of the first transistor 405a is coupled to the current source 407, then a second terminal of the first transistor 405a can be coupled to a first output terminal 413a of the mixer cell 117a. The mixer cell 117a can be configured, in response to a first state of the current source drive signal 411a (for example logic 1 or logic 0), to impress a first current $I_1$ at the first output terminal 413a and, in response to a second state of the current source drive signal 411a (for example logic 0 or logic 1), to impress no current at the first output terminal 413a or to refrain from impressing the first current $I_1$ at the first output terminal 413a. The first output terminal 413a can furthermore be coupled to further first output terminals 413a of further mixer cells from the plurality of mixer cells 117a-117m and can furthermore be coupled to a first output terminal of a vector modulator in which the mixer cells are used, at which output terminal the vector modulator provides the first subcomponent 101-1 of the differential vector-modulated output signal 101. In other words, a vector modulator in accordance with one example embodiment of the present disclosure can be configured to provide the first subcomponent 101-1 of the differential vector-modulated output signal 101 such that the subcomponent is based on a superposition of first currents $I_1$ of the plurality of mixer cells. In this case, the first current $I_1$ provided by the mixer cell 117a at the first output terminal 413a is based on the total current $I_g$ of the current source that is impressed or provided by the current source 407. The NOR combinations 401a-401d, the OR combination 403a and the first transistor 405a are therefore configured, depending on the clock signals 121a-121d and the single-bit signals 113a-1-113d-1 of the combined IQ signals 113a-113d, to impress the first current $I_1$ at the first output terminal 413a, the current being superposed with further first currents $I_1$ of further mixer cells at a first output terminal of a vector modulator, such that the first subcomponent 101-1 of the differential vector-modulated output signal 101 is based on a superposition of the first currents $I_1$.

Furthermore, the fifth NOR combination 401e is configured to logically combine (NOR) the first clock signal 121a with the first single-bit signal 113b-1 of the second combined IQ signal 113b in order to obtain a fifth combined clock-IQ signal 409e-1. Furthermore, the sixth NOR combination 401f is configured to logically combine (NOR) the second clock signal 121b with the first single-bit signal 113a-1 of the combined IQ signal 113a in order to obtain a sixth combined clock-IQ signal 409f-1. The seventh NOR combination 401g is configured to logically combine (NOR) the third clock signal 121c with the first single-bit signal 113d-1 of the fourth combined IQ signal 113d in order to obtain a seventh combined clock-IQ signal 409g-1. The eighth NOR combination 401h is configured to logically combine (NOR) the fourth clock signal 121d with the first single-bit signal 113c-1 of the third combined IQ signal 113c in order to obtain an eighth combined clock-IQ signal 409h-1.

The second OR combination 403b is configured to logically combine (OR) the combined clock-IQ signals 409e-1-409h-1 in order to obtain a second current source drive signal 411b. The second transistor 405b is configured to receive said second current source drive signal 411b in order to put its switching path into a low-impedance or a high-impedance state depending on the current source drive signal 411b. A first terminal of the second transistor 405b is coupled to the first terminal of the first transistor 405a and to the first terminal of the current source 407. A second terminal of the transistor 405b is coupled to a second output terminal 413b of the mixer cell 117a, at which output terminal the mixer cell 117a impresses a second current $I_2$ depending on the current source drive signal 411b. The second output terminal 413b of the mixer cell 117a can be coupled to further second output terminals 413b of the other mixer cells from the plurality of mixer cells 117a-117m and, furthermore, said second output terminals 413b can be coupled to a second output terminal of a vector modulator in accordance with one example embodiment of the present disclosure (for example of the vector modulator 200 or 200'), at which output terminal the vector modulator provides the second subcomponent 101-1 of the differential vector-modulated output signal 101. The currents $I_2$ provided by the mixer cells 117a-117m are therefore superposed at the second output terminal of the vector modulator, such that the second subcomponent 101-2 of the differential vector-modulated output signal 101 is based on a superposition of the second currents $I_2$.

In other words, the mixer cell 117a is configured to combine each received drive signal 113a-1, 113b-1, 113c-1, 113d-1a first time with one of the received clock signals 121a-121d in order to obtain the first current source drive signal 411a, and to combine the drive signal a second time with a further one of the received clock signals 121a-121d in order to obtain the second current source drive signal 411b, to impress the second current $I_2$ at the second output terminal 413b of the mixer cell 117a in response to a first state of the second current source drive signal 411b and to impress no current at the second output terminal 413b of the mixer cell 117a in response to a second state of the second current source drive signal 411b or to refrain from impressing the second current $I_2$ at the second output terminal 413b of the mixer cell 117a in response to the second state of the second current source drive signal 411b.

The baseband combination circuit 111' shown in FIG. 3, which carries out a common-mode suppression, can in this case be configured to provide the combined IQ signals 113a-1 to 113d-1 such that none of the mixer cells 117a-117m (apart from at changeover instants) at any instant provides both the first current $I_1$ and the second current $I_2$, since this superposition would not contribute to the information content of the resulting differential vector-modulated output signal 101, since the currents would mutually neutralize one another in the resulting differential vector-modulated output signal 101. In other words, the baseband combination circuit 111' is configured to provide the combined IQ signals 113a-113d such that (apart from at changeover instants) at every instant each mixer cell from the plurality of mixer cells 117a-117m provides a maximum of one current ($I_1$ or $I_2$).

The third transistor 405c shown in FIG. 4a, which is an optional transistor of the mixer cell 117a, is configured to provide a bias voltage at the first terminal of the current source 407 in response to a received charge signal 415. For this purpose, a first terminal of the third transistor 405c is coupled to a reference potential terminal (for example for the supply voltage potential VDD) and a second terminal of the third transistor 405c is coupled to the first terminal of the current source 407. A control terminal of the third transistor 405c is configured to receive the charge signal 415.

The charge signal 415 is only switched with a short pulse before data are transmitted. The third transistor makes it possible that the mixer cell 117a can react even to very fast changes in the (digital) current source drive signals 411a, 411b.

Even though the third transistor 405c is not present or not shown in the mixer cells additionally presented hereinafter, these mixer cells can nevertheless also have such a transistor or be extended by such a transistor which is connected between the current source of the mixer cells and a reference potential terminal (for example for the supply voltage potential VDD).

In accordance with further example embodiments, the NOR combinations 401a-401h can also be replaced by logical AND combinations 401a-401h.

To summarize, FIG. 4A shows the circuit of an individual mixer cell 117a with the logical combination of the signals. Logic circuits of different types are possible. The OR combinations 403a, 403b with the four input signals can also be realized by quadrupling the switching transistors.

FIG. 4B shows a further possible implementation of the mixer cell 117a and one possible implementation of the RF balun 133 of the vector modulators 200, 200', 300. Although, in the circuit shown in FIG. 4B, only the one mixer cell 117a is coupled to the RF balun 133, typically the plurality of mixer cells 117a-117m of the vector modulators 200, 200', 300 are all coupled to the RF balun 133 in parallel, such that the differential vector-modulated output signal 101 is based on a superposition of the currents $I_1$, $I_2$ provided by the mixer cells 117a-117m at the RF balun 133.

The implementation of the mixer cell 117a as shown in FIG. 4B has the same functionality as the implementation shown in FIG. 4A. The mixer cell 117a has a first transistor 421a, a second transistor 421b and a third transistor 421c. Furthermore, the mixer cell 117a has the current source 407. A first terminal of the first transistor 421a is coupled to the first terminal of the current source 407, a second terminal of the first transistor 421a is coupled to a first terminal of the second transistor 421b and a first terminal of the third transistor 421c. A control terminal of the first transistor 421a is configured to receive the first single-bit signal 113a-1 of the first combined IQ signal 113a. Furthermore, a second terminal of the second transistor 421b is coupled to the first output terminal 413a of the mixer cell 117a and a second terminal of the third transistor 421c is coupled to the second output terminal 413b of the mixer cell 117a. A control terminal of the second transistor 421b is configured to receive the first clock signal 121a and a control terminal of the third transistor 421b is configured to receive the second clock signal 121b.

Furthermore, the mixer cell 117a has a fourth transistor 421d, a fifth transistor 421e and a sixth transistor 421f. A first terminal of the fourth transistor 421d is coupled to the first terminal of the current source 407, a second terminal of the fourth transistor 421d is coupled to a first terminal of the fifth transistor 421e and a first terminal of the sixth transistor 421f and a control terminal of the fourth transistor 421d is configured to receive the first single-bit signal 113b-1 of the second combined IQ signal 113b. A second terminal of the fifth transistor 421e is coupled to the first output terminal 413a of the mixer cell 117a and a second terminal of the sixth transistor 421f is coupled to the second output terminal 413b of the mixer cell 117a. A control terminal of the fifth transistor 421e is configured to receive the second clock signal 121b and a control terminal of the sixth transistor 421f is configured to receive the first clock signal 121a.

Furthermore, the mixer cell 117a has a seventh transistor 421g, an eighth transistor 421h and a ninth transistor 421i. A first terminal of the seventh transistor 421g is coupled to the first terminal of the current source 407 and a second terminal of the seventh transistor 421g is coupled to a first terminal of the eighth transistor 421h and a first terminal of the ninth transistor 421i. A control terminal of the seventh transistor 421g is configured to receive the first single-bit signal 113c-1 of the third combined IQ signal 113c. Furthermore, a second terminal of the eighth transistor 421h is coupled to the first output terminal 413a of the mixer cell 117a and a second terminal of the ninth transistor 421i is coupled to the second output terminal 413b of the mixer cell 117a. A control terminal of the eighth transistor 421h is configured to receive the third clock signal 121c and a control terminal of the ninth transistor 421i is configured to receive the fourth clock signal 121d.

Furthermore, the mixer cell 117a has a tenth transistor 421j, an eleventh transistor 421k and a twelfth transistor 421l. A first terminal of the tenth transistor 421j is coupled to the first terminal of the current source 407 and a second terminal of the tenth transistor 421j is coupled to a first terminal of the eleventh transistor 421k and a first terminal of the twelfth transistor 421l. A control terminal of the tenth transistor 421j is configured to receive the first single-bit signal 113d-1 of the fourth combined IQ signal 113d. Furthermore, a second terminal of the eleventh transistor 421k is coupled to the first output terminal 413a of the mixer cell 117a and a second terminal of the twelfth transistor 421l is coupled to the second output terminal 413b of the mixer cell 117a. A control terminal of the eleventh transistor 421k is configured to receive the fourth clock signal 121d and a control terminal of the twelfth transistor 421l is configured to receive the third clock signal 121c.

Furthermore, the RF balun 133 has a series circuit comprising a first capacitance 423a and a second capacitance 423b, which is connected between a first output terminal 116-1 and a second output terminal 116-2 of the RF balun 133. The output terminals 116-1, 116-2 can for example together form the output terminal 116 of the vector modulators 200, 200', 300, at which output terminal the vector modulators 200, 200', 300 provide the differential vector-modulated output signal 101. More precisely the RF balun 133 can be configured to provide the first subcomponent 101-1 of the differential vector-modulated output signal 101 at its first output terminal 116-1, and to provide the second subcomponent 101-2 of the differential vector-modulated output signal 101 at its second output terminal 116-2. Furthermore, the RF balun 133 can have a first inductance 427a and a second inductance 427b. A first terminal of the first inductance 427a can be coupled to the first output terminal 116-1 of the RF balun 133 and a second terminal of the inductance 427a can be coupled to a second terminal of the second inductance 427b and a reference potential terminal (for example for a supply potential). A first terminal of the second inductance 427b can be coupled to the second output terminal 116-2 of the RF balun 133.

As already mentioned, the functionality of the implementation of the mixer cell 117a as shown in FIG. 4B is comparable with the implementation of the mixer cell 117a as shown in FIG. 4A. Thus, the series circuit comprising the first transistor 421a and the second transistor 421b corresponds to the first NOR combination 401a and the series circuit comprising the first transistor 421a and the third transistor 421c corresponds to the fifth NOR combination 401f. The series circuit comprising the fourth transistor 421d and the fifth transistor 421e corresponds to the second NOR combination 401b and the series circuit comprising the fourth transistor 421d and the fifth transistor 421e corresponds to the fifth NOR combination 401e. The series circuit comprising the seventh transistor 421g and the eighth transistor 421h corresponds to the third NOR combination 401c and the series circuit comprising the seventh transistor 421g and the ninth transistor 421i corresponds to the eighth NOR combination 401h. The series circuit comprising the tenth transistor 421j and the eleventh transistor 421k corresponds to the fourth NOR combination 401d and the series circuit comprising the tenth transistor 421j and the twelfth transistor 421l corresponds to the seventh NOR combination 401g.

As also in the implementation of the mixer cell 117a as shown in FIG. 4A, therefore, in the implementation of the mixer cell 117a as shown in FIG. 4B, too, a current source drive signal for the first current $I_1$ and a current source drive signal for the second current $I_2$ are based on combinations of the clock signals 121a-121d with the single-bit signals 113a-1-113d-1 of the combined IQ signals 113a-113d.

To summarize, what the implementations of the mixer cell 117a shown in FIGS. 4A and 4B have in common is that a single current source 407 per mixer cell 117a suffices to provide the differential vector-modulated output signal 101.

FIG. 4C shows a further possible implementation of the mixer cell 117a. The implementation of the mixer cell 117a as shown in FIG. 4C differs from the implementation shown in FIG. 4B in that the implementation shown in FIG. 4C has a first current source 407a and a second current source 407b (in contrast to the single current source 407 in the implementation shown in FIG. 4B).

The use of the two separate current sources 407a, 407b makes it possible that already known mixer cells (having a separate mixer cell array for in-phase components and quadrature components) can also be used. Furthermore, the combination of the in-phase component 103 and quadrature component 105 as described in FIG. 3 makes it possible to achieve the common-mode suppression in the resulting differential output signal 101.

The implementation of the mixer cell 117a as shown in FIG. 4C differs from the implementation shown in FIG. 4B specifically in that the first terminal of the first transistor 421a and the first terminal of the fourth transistor 421d are coupled to a first terminal of a first current source 407a, and in that the first terminal of the seventh transistor 421g and the first terminal of the ninth transistor 421j are coupled to a first terminal of a second current source 407b (which differs from the first current source 407a).

FIG. 4D shows a further possible implementation of the mixer cell 117a, wherein the implementation shown in FIG. 4D, in the same way as already the implementation shown in FIG. 4C, is based on the fact that two individual current sources 407a, 407b are used.

The implementation of the mixer cell 117a as shown in FIG. 4D has a first transistor 441a, a second transistor 441b, a third transistor 441c and a fourth transistor 441d. A first terminal of the first transistor 441a and a first terminal of the second transistor 441b are coupled to the first terminal of the first current source 407a, a second terminal of the first transistor 441a is coupled to the first output terminal 413a of the mixer cell 117a and a second terminal of the second transistor 441b is coupled to the second output terminal 413b of the mixer cell 117a. A first terminal of the third transistor 441c and a first terminal of the fourth transistor 441d are coupled to the first terminal of the second current source 407b. Furthermore, a second terminal of the third transistor 441c is coupled to the second output terminal 413b of the mixer cell 117a and a second terminal of the fourth transistor 441d is coupled to the first output terminal 413a of the mixer cell 117a. Furthermore, the mixer cell 117a has a first NOR combination 443a, a second NOR combination 443b, a third NOR combination 443c, a fourth NOR combination 443d, a fifth NOR combination 443e, a sixth NOR combination 443f, a seventh NOR combination 443g and an eighth NOR combination 443h.

The first NOR combination 443a is configured to logically combine the second clock signal 121b with the first single-bit signal 113a-1 of the first combined IQ signal 113 in order to obtain a first NOR-combined IQ signal 445a. The second NOR combination 443b is configured to logically combine the first clock signal 121a with the first single-bit signal 113b-1 of the second combined IQ signal 113b in order to obtain a second NOR-combined signal 445b. The third NOR combination 443c is configured to logically combine the first clock signal 121a with the first single-bit signal 113a-1 of the first combined IQ signal 113a in order to obtain a third NOR-combined signal 445c. The fourth NOR combination 443d is configured to logically combine the second clock signal 121b with the first single-bit signal 113b-1 of the second combined IQ signal 113b in order to obtain a fourth NOR-combined signal 445d. The fifth NOR combination 443e is configured to logically combine the fourth clock signal 121d with the first single-bit signal 113c-1 of the third combined IQ signal 113c in order to obtain a fifth NOR-combined signal 445e. The sixth NOR combination 443f is configured to logically combine the third clock signal 121c with the first single-bit signal 113d-1 of the fourth combined IQ signal 113d in order to obtain a sixth NOR-combined signal 445f. The seventh NOR combination 443g is configured to logically combine the third clock signal 121c with the third single-bit signal 113c-1 of the third combined IQ signal 113c in order to obtain a seventh NOR-combined signal 445g. The eighth NOR combination 443h is configured to logically combine the fourth clock signal 121d with the first single-bit signal 113d-1 of the first combined IQ signal 113d in order to obtain an eighth NOR-combined signal 445h.

Furthermore, the mixer cell 117a has a ninth NOR combination 447a, a tenth NOR combination 447b, an eleventh NOR combination 447c and a twelfth NOR combination 447d. The ninth NOR combination 447a is configured to logically combine the first NOR-combined signal 445a and the second NOR-combined signal 445b in order to obtain a first current source drive signal 449a. The tenth NOR combination 447b is configured to logically combine the third NOR-combined signal 445c with the fourth NOR-combined signal 445d in order to obtain a second current source drive signal 449b. The eleventh NOR combination 447c is configured to logically combine the fifth NOR-combined signal 445e with the sixth NOR-combined signal 445f in order to obtain a third current source drive signal 449c. The twelfth NOR combination 447d is configured to logically combine the seventh NOR-combined signal 445g with the eighth NOR-combined signal 445h in order to obtain a fourth current source drive signal 449d.

The first transistor 441a is configured to receive the first current source drive signal 449a at its control input. The second transistor 441b is configured to receive the second current source drive signal 449b at its control input. The third transistor 441c is configured to receive the third current source drive signal 449c at its control input. The fourth transistor 441d is configured to receive the fourth current source drive signal 449d at its control input.

Although the implementation of the mixer cell 117a as shown in FIG. 4D is based on the fact that the clock signals 121a-121d which have a duty cycle of 25% are used for driving, in accordance with further example embodiments in the implementation shown in FIG. 4D it is nevertheless also possible to choose driving with a duty cycle of 50%, for example on the basis of the subcomponents 107-1, 107-2 of the first LO signal 107 and the subcomponents 109-1, 109-2 of the second LO signal 109.

According to further example embodiments, the implementation of the mixer cell 117a as shown in FIG. 4D can also be constructed using AND gates or NANDs.

Even in an application of the mixer cell 117a in which clock signals having a duty cycle of 50% are used, the common-mode suppression shown in FIG. 3 can still be carried out. In other words, the common-mode suppression can also be used in a digital vector modulator having a duty cycle of 50%.

FIG. 5A shows a schematic illustration of a vector modulator 500 in accordance with a further example embodiment of the present disclosure. The vector modulator 500 shown in FIG. 5A can form one possible implementation of the device 100 shown in FIGS. 1A and 1B.

The vector modulator 500 shown in FIG. 5a differs from the vector modulator 300 shown in FIG. 3 in that the combination of the combined IQ signals 113a-113d with the first LO signal 107 and the second LO signal 109 are moved upstream of the decoder 127 or upstream of mixer cells 117a'-117m' of the vector modulator 500. In other words, in the vector modulator 500, a combination of the in-phase component 103 and of the quadrature component 105 with the first LO signal 107 and the second LO signal 109 is carried out actually upstream of the mixer cells 117a'-117m'. A clock combination circuit 119' of the vector modulator 500 is therefore configured to receive the first LO signal 107 and the second LO signal 109 and also the combined IQ signals 113a-113d (each having a plurality of single-bit signals) in order to combine these received signals with one another in order to obtain a plurality of combined clock-IQ components 409a-409h, wherein each of said combined clock-IQ components has a plurality of single-bit signals (that is to say a plurality of combined clock-IQ signals), which form drive signals for the plurality of mixer cells 117a'-117m' or on the basis of which the decoder 127 generates drive signals for the mixer cells 117a'-117m'.

Figure 5B:
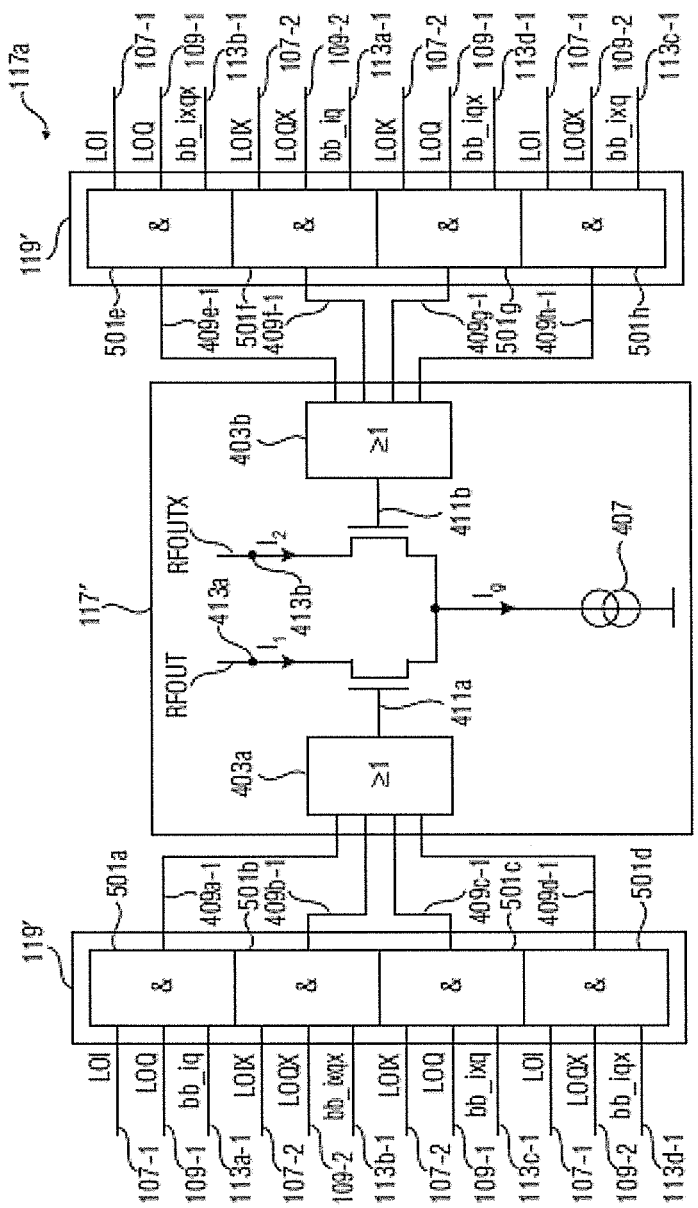

FIG. 5B shows in this respect a mixer cell 117a', such as can be used in the vector modulator 500 shown in FIG. 5A, together with a part of the clock combination circuit 119' which is configured to generate the combined clock-IQ signals 409a-1-409h-1 for said mixer cell 117a', such that said signals serve as drive signals for the mixer cell 117a'. As can be seen from FIG. 5B, the clock combination circuit 119' carries out the individual combinations of the combined IQ signals 113a-113d with the LO signals 107, 109 at the single-bit level (as is also the case for the mixer cell 117a shown in FIG. 4A). Therefore, the mixer cell 117a' shown in FIG. 5B differs from the mixer cell 117a shown in FIG. 4A in that the combination of the single-bit signals 113a-1-113d-1 of the combined IQ signals 113a-113d with the individual clock signals 121a-121d is already carried out outside the mixer cell 117a', such that the mixer cell 117a' is merely still configured to carry out the first OR combination 403a of the combined clock-IQ signals 409a-1-409d-1 in order to obtain the first current source drive signal 411a, and to carry out the second OR combination of the combined clock-IQ signals 409e-1-409h-1 in order to obtain the second current source drive signal 411b.

In accordance with further example embodiments, the first OR combination 403a and the second OR combination 403b can also be moved upstream of the mixer cell 117a' (for example be integrated into the clock combination circuit 119'). In this case, a mixer cell in accordance with example embodiments of the present disclosure would only carry out the digital-to-analog conversion based on the received first current source drive signal 411a and the received second current source drive signal 411b.

This has the advantage that an analog design can be virtually completely dispensed with since all of the necessary combinations can be carried out by means of logical combinations already outside the mixer cells.

The clock combination circuit 119' is configured to carry out the logical combinations shown in FIG. 5B for each single-bit signal of the combined IQ signals 113a-113d. The combined IQ-clock signals 409a-1-409h-1 resulting from these logical combinations each have a duty cycle of <50%. In accordance with further example embodiments, the combined clock-IQ signals 409a-1-409h-1 can have maximally a duty cycle of 25%.

The exact structure of the clock combination circuit 119' as shown in FIG. 5B will be described hereinafter.

The clock combination circuit 119' is configured to logically combine the first subcomponent 107-1 of the first LO signal 107, the first subcomponent 109-1 of the second LO signal 109 and the first single-bit signal 113a-1 of the first combined IQ signal 113a in the context of a first logical AND combination 501a in order to obtain the first clock-IQ combined signal 409a-1.

Furthermore the clock combination circuit 119' is configured to logically combine the second subcomponent 107-2 of the first LO signal 107, the second subcomponent 109-2 of the second LO signal 109 and the first single-bit signal 113b-1 of the second combined IQ signal 113b in the context of a second logical AND combination 501b in order to obtain the second combined clock-IQ signal 409b-1. Furthermore, the clock combination circuit 119' is configured to logically combine the second subcomponent 107-2 of the first LO signal 107, the first subcomponent 109-1 of the second LO signal 109 and the first single-bit signal 113c-1 of the third combined IQ signal 113c in the context of a third logical AND combination 501c in order to obtain the third combined clock IQ signal 409c-1. Furthermore, the clock combination circuit 119' is configured to logically combine the first subcomponent 107-1 of the first LO signal 107, the second subcomponent 109-2 of the second LO signal 109 and the first single-bit signal 113d-1 of the fourth combined IQ signal 113d in the context of a fourth logical AND combination 501d in order to obtain the fourth combined clock-IQ signal 409d-1. Furthermore the clock combination circuit 119' is configured to locally combine the first subcomponent 107-1 of the first LO signal 107, the first subcomponent 109-1 of the second LO signal 109 and the first single-bit signal 113b-1 of the second combined IQ signal 113b in the context of a fifth logical AND combination 501e in order to obtain the fifth combined clock IQ signal 409e-1. Furthermore, the clock combination circuit 119' is configured to logically combine the second subcomponent 107-2 of the first LO signal 107, the second subcomponent 109-2 of the second LO signal 109 and the first single-bit signal 113a-1 of the first combined IQ signal 113a in the context of a sixth logical AND combination 501f in order to obtain the sixth clock-IQ signal 409f-1. Furthermore, the clock combination circuit 119' is configured to logically combine the second subcomponent 107-2 of the first LO signal 107, the first subcomponent 109-1 of the second LO signal 109 and the first single-bit signal 113d-1 of the fourth combined IQ signal 113d in the context of a seventh logical AND combination 501g in order to obtain the seventh combined clock-IQ signal 409g-1. Furthermore, the clock combination circuit 119' is configured to logically combine the first subcomponent 107-1 of the first LO signal 107, the second subcomponent 109-2 of the second LO signal 109 and the first single-bit signal 113c-1 of the third combined IQ signal 113c in the context of an eighth logical AND combination 501h in order to obtain the eighth combined clock-IQ signal 409h-1.

As already explained, the clock combination circuit 119' or the mixer cell 117' can furthermore be configured to logically combine the combined IQ signals 409a-1, 409d-1 in the context of the first logical OR combination 403a in order to obtain the first current source drive signal 411a and to logically combine the combined clock-IQ signals 409e-1, 409h-1 in the context of the second logical OR combination 403b in order to obtain the second current source drive signal 411b.

The illustration of the mixer cell 117a' as chosen in FIG. 5B has dispensed with including the optional transistor 405c, as shown in FIG. 4A.

In accordance with further example embodiments the logical AND combinations 501a-501h as shown in FIG. 5B can also be replaced by logical NOR combinations 501a-501h.

Figure 6A:
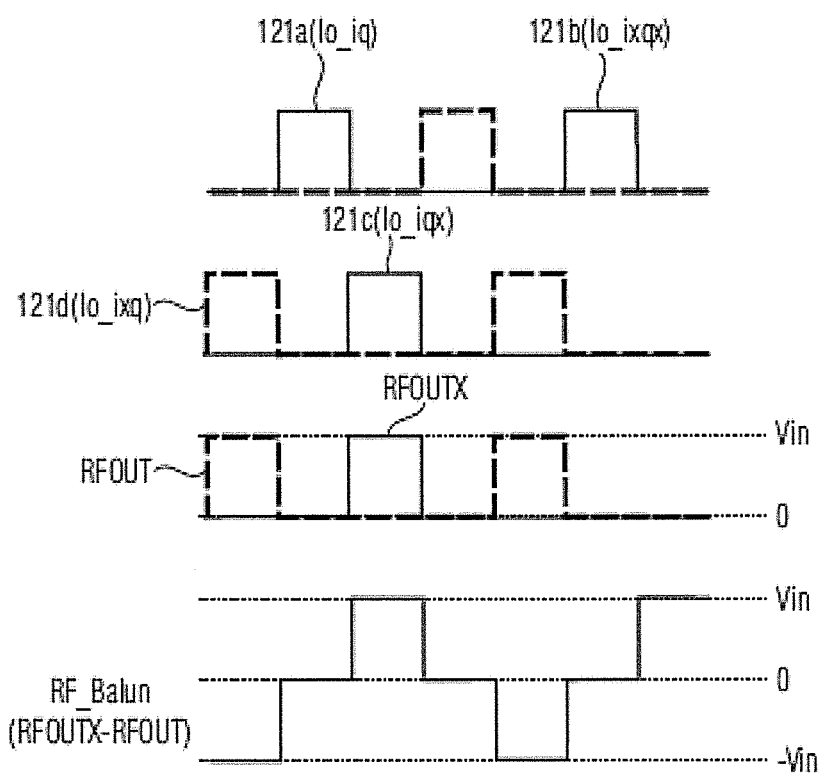
FIGS. 6A-6C show examples of signal profiles such as can occur in example embodiments of the present disclosure.
Figure 9:
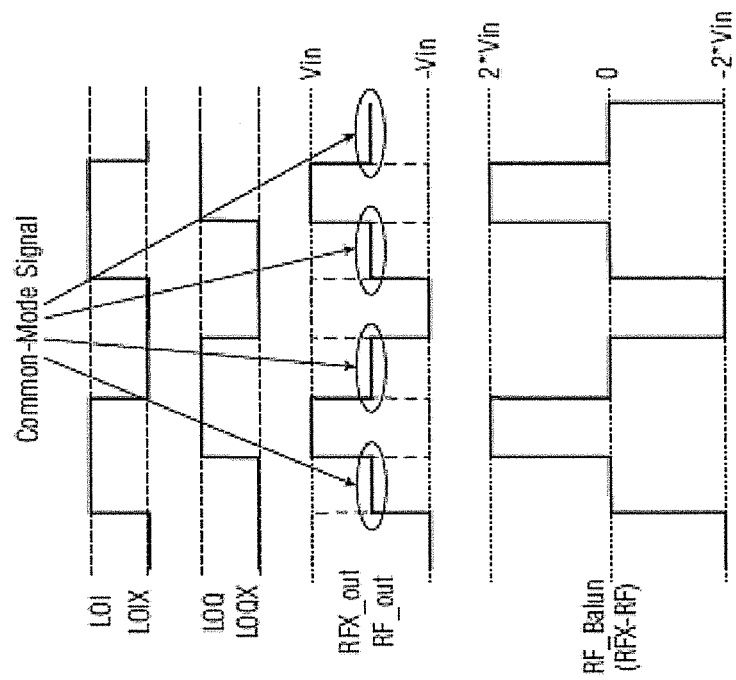
FIG. 9 shows an illustration of an example output signal for a vector modulator without common-mode suppression.
Figure 9:
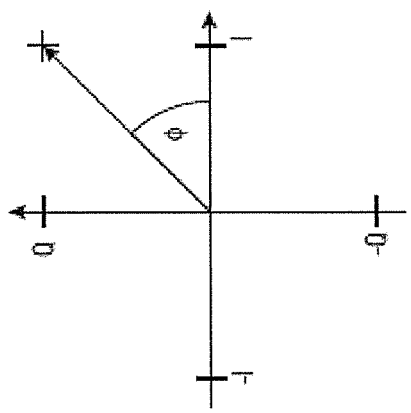

FIG. 6A shows by way of example the clock signals 121a-121d, such as can be present for example at the mixer cell 117a, as shown in FIG. 4A. Furthermore, FIG. 6A shows resulting output signals RFOUT (at the first output terminal 413a of the mixer cell 117a and on the basis of the first current $I_1$) and RFOUTX (at the second output terminal 413b of the mixer cell 117a and on the basis of the second current $I_2$) for I=Q=1. Furthermore, FIG. 6A shows with the signal RF_Balun the resulting differential output signal of the mixer cell 117a, which arises from subtraction of the signal RFOUT from the signal RFOUTX. It becomes clear that, in particular in comparison with FIG. 9, common-mode signals are no longer present.

Figure 6B:
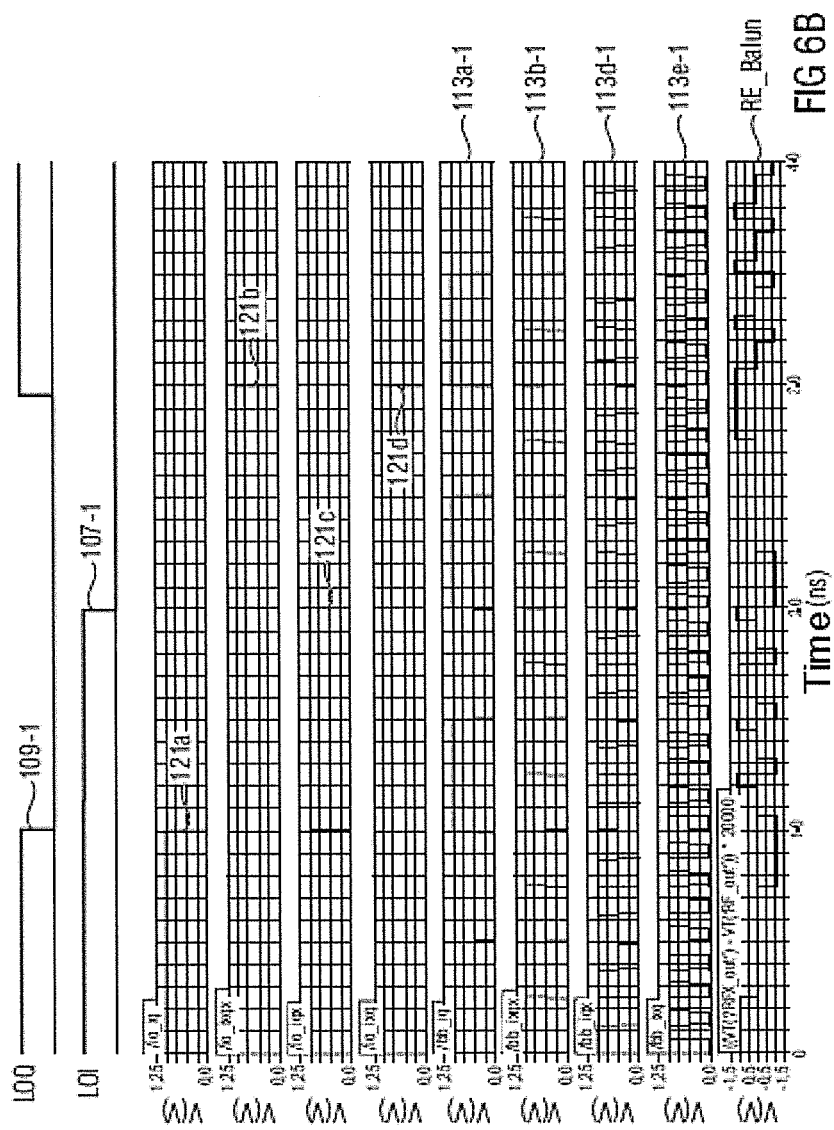

Furthermore, FIG. 6B shows further signal profile diagrams such as can occur in the mixer cell 117a, wherein, in order to be able also to show all possible signal states in FIG. 6B, a higher frequency than is the case in the actual application was chosen for the in-phase component 103 and the quadrature component 105. Furthermore, FIG. 6B shows the clock signals 121a-121d, each having a duty cycle of 25%. Furthermore, FIG. 6B shows example signal profiles for the single-bit signals 113a-1-113d-1 of the combined IQ signals 113a-113d, which are based on the in-phase component 103 and the quadrature component 105. In this case, as also already in FIG. 6A, the output signal RF_Balun results from the subtraction of the output signal RFOUT provided at the first output terminal 413a of the mixer cell 117a from the output signal RFOUTX provided at the second output terminal 413b of the mixer cell 117a.

Figure 6C:
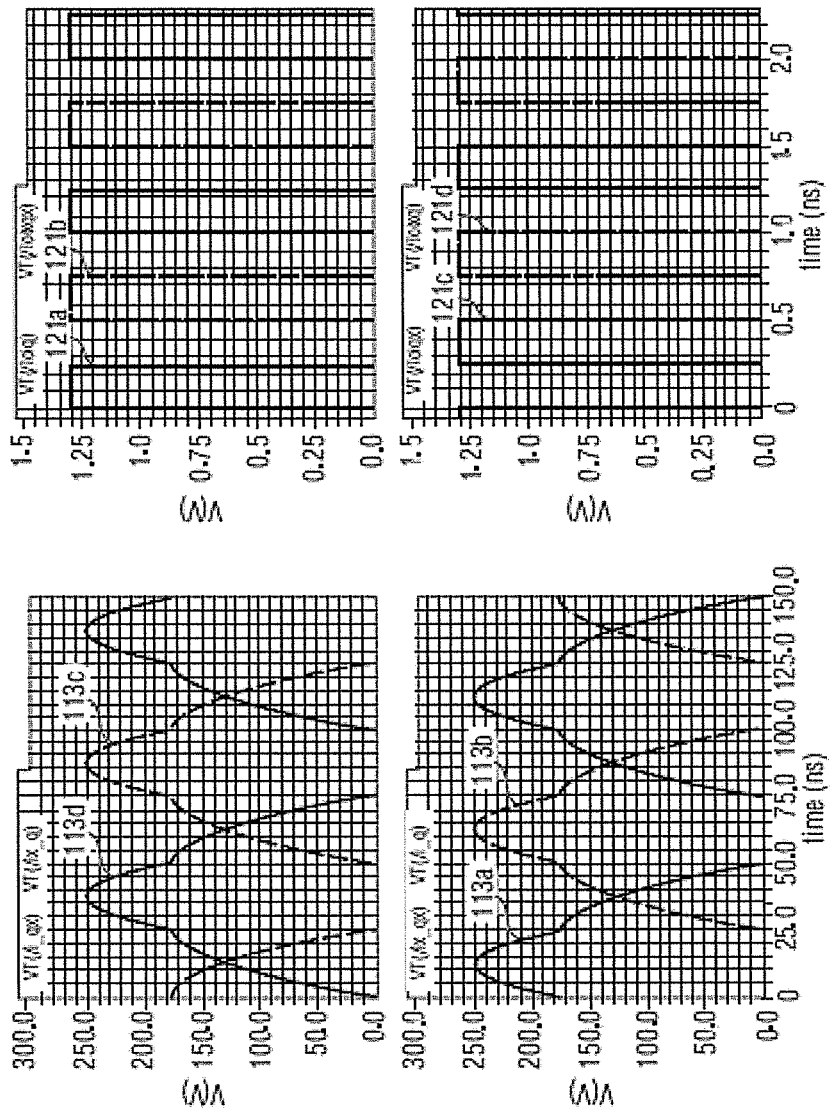
Figure 7:
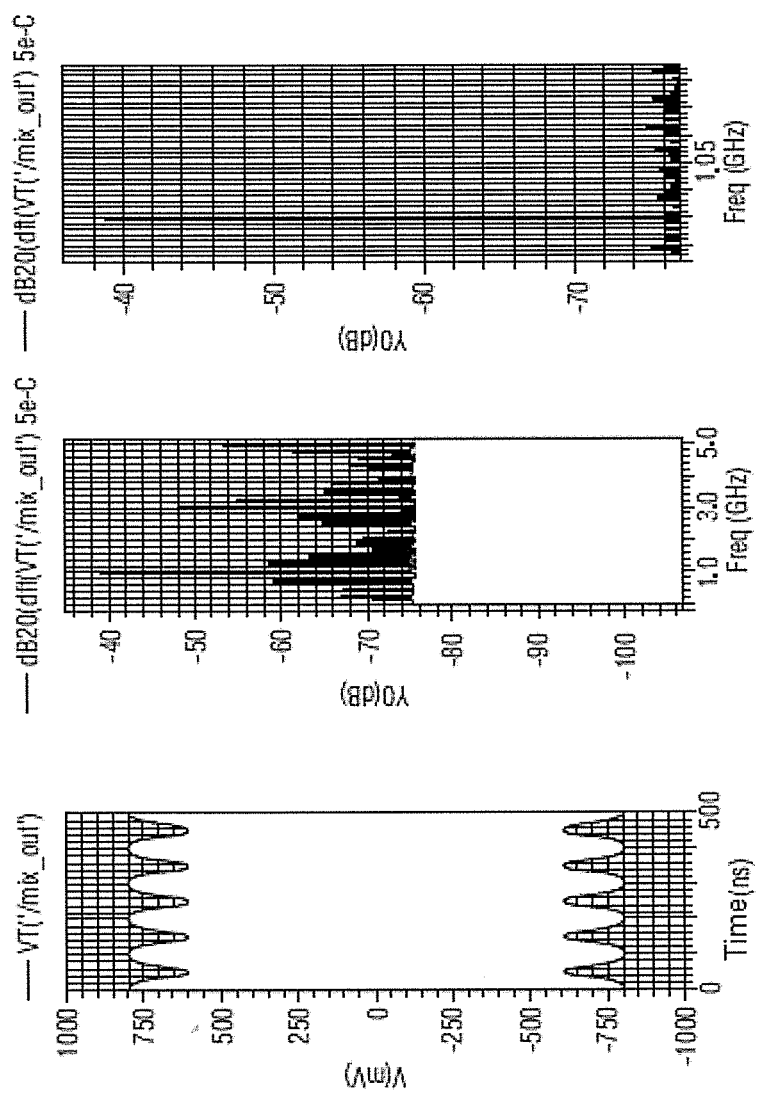
FIG. 7 shows diagrams for illustrating a simulated output behaviour of a vector modulator in accordance with one example embodiment of the present disclosure.

Furthermore, FIG. 6C shows, in the two diagrams on the left, an example of the combined IQ signals 113a-113d, after the additions 131a-131d, and, in the two diagrams on the right, a further illustration of the clock signals 121a-121d. Furthermore, FIG. 7 shows the simulated transient output signal and the output spectrum of the digital vector modulator 200 having a DAC resolution of 256 bits and LO frequency of 1 GHz. The output spectrum shows only the desired sideband of the vector modulator with full suppression of the undesired carrier band and sideband. To summarize, example embodiments of the present disclosure can have internally a fully digital signal processing; thus, by way of example, the clock signals 121a-121d and the combined IQ signals 113a-113d can be digital signals which are subjected to digital-to-analogue conversion into the analogue differential vector-modulated output signal 101 by the mixer cells 117a-117m or 117a'-117m'.

In other words, in example embodiments of the present disclosure, a completely digital vector modulation can be carried out, to be precise through to the provision of the current source drive signals (for example for the current sources 407, 407*a*, 407*b*). Thus, as described above, the baseband combination circuits 111, 111' can be configured to carry out the additions and the logical combinations in the digital domain in order to obtain the resulting output signals thereof (for example the combined IQ signals 113*a*-113*n*) as digital signals. Furthermore, the clock combination circuits 119, 119' can also be configured to carry out their logical combination in the digital domain in order to obtain the resulting output signals thereof (for example the clock signals 121*a*-121*b* and the combined clock-IQ signals 409*a*-1-409*g*-1) as digital signals. The digital-to-analogue conversion then takes place only in the mixer cells 117*a*-117*m*, 117*a'*-117*m'*.

In example embodiments of the present disclosure, therefore, the complete digital vector modulation can be realized with only one RF-DAC./mixer array with switchable current sources (within the mixer cells). The modulation of the quadrature carrier signal with the rectified baseband signals added together and the subsequent superposition of both mixer output signals are effected by digital circuits in the chip.

In other words, in example embodiments of the present disclosure, the operation of mixing the carrier signal with the digital baseband signal takes place in the digital drive circuit (for example in the baseband combination circuits 111, 111' and/or in the clock combination circuits 119, 119'). The binary output word of the digital part (for example the generated single-bit signals of the combined IQ signals 113*a*-113*d*) switches a cell array with switchable current sources. In this case, the function of digital-to-analogue conversion is effected in each individual element (in each individual mixer cell 117*a*-117*m*, 117*a'*-117*m'*) in the cell array. In contrast to conventional vector modulators, in example embodiments of the present disclosure, two DA converters/mixers or cell arrays are no longer necessary, since the above-described skilful combination of the in-phase component 103 with the quadrature component 105 and of the first LO signal 107 with the second LO-signal 109 makes it possible for one cell array to suffice for mixing and modulating both the in-phase components and the quadrature components.

Further example embodiments of the present disclosure provide a (portable) mobile radio device comprising: a device (for example one of the devices 100, 200, 200', 300, 500) for generating the vector-modulated output signal 101 in accordance with one example embodiment of the present disclosure, a baseband processor, which is coupled to the device for generating the vector-modulated output signal 101 and is configured to provide the baseband signal to the device for generating the vector-modulated output signal 101 and an antenna, which is coupled to the device for generating the vector-modulated output signal 101 and is configured to transmit the vector-modulated output signal 101.

By way of example, such a (portable) mobile radio device can be a mobile handheld device such as, for example, a mobile telephone, a so-called smart phone, a tablet PC, a broadband modem, a notebook or a laptop, but also a router or a PC.

Figure 8:
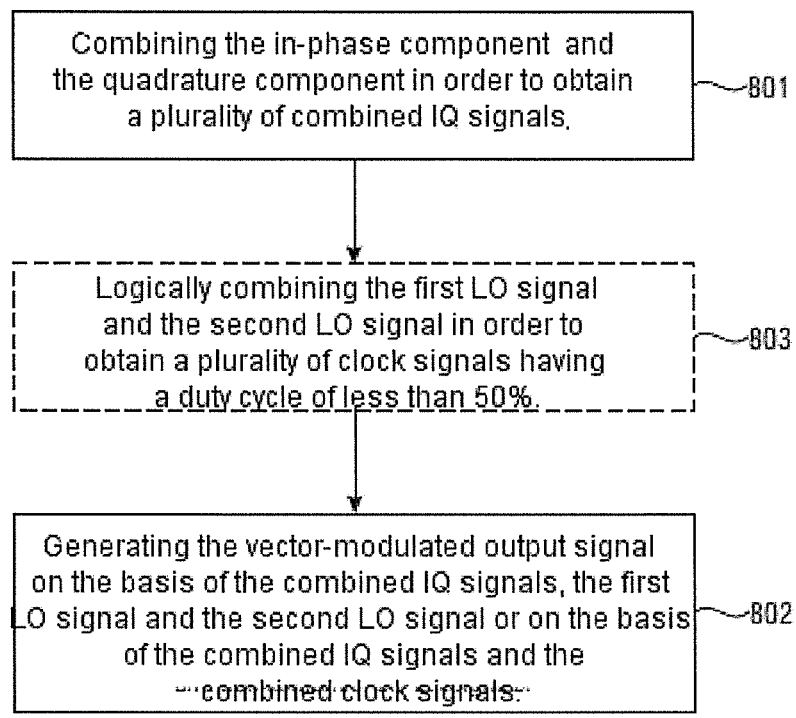
FIG. 8 shows a flowchart of a method in accordance with one example embodiment of the present disclosure.

FIG. 8 shows a flowchart of a method 800 in accordance with one example embodiment of the present disclosure.

The method 800 for generating a vector-modulated output signal based on a baseband signal having an in-phase component and a quadrature component, a first LO signal for the in-phase component of the baseband signal and a second LO signal for the quadrature component of the baseband signal comprises a step 801 of combining the in-phase component and the quadrature component in order to obtain a plurality of combined IQ signals.

Furthermore, the method 800 comprises generating the vector-modulated output signal based on the combined IQ signals, the first LO signal and the second LO signal at 802.

In accordance with further example embodiments, the method 800 can comprise an optional act 803, in which the first LO signal and the second LO signal are logically combined in order to obtain a plurality of (combined) clock signals having a duty cycle of less than 50%. In act 802 the vector-modulated output signal can then be generated based on the IQ signals and the plurality of clock signals.

In accordance with further example embodiments, at 802 the vector-modulated output signal can be generated as a differential output signal having a first subcomponent and a second subcomponent, wherein the differential vector-modulated output signal is provided such that the first subcomponent thereof is based on a superposition of a plurality of first currents generated by a plurality of mixer cells and the second subcomponent thereof is based on a superposition of second currents generated by the plurality of mixer cells, and wherein the in-phase component and the quadrature component are combined such that (apart from changeover instants) each mixer cell from the plurality of mixer cells provides maximally either a first current or a second current.

The method 800 can be carried out by devices or vector modulators in accordance with example embodiments of the present disclosure.

Although some aspects have been described in connection with a device, it goes without saying that these aspects also constitute a description of the corresponding method, such that a block or a component of a device should also be understood as a corresponding method step or as a feature of a method step. Analogously to this, aspects which have been described in connection with or as a method step also constitute a description of a corresponding block or detail or feature of a corresponding device.

Depending on specific implementation requirements, example embodiments of the disclosure can be implemented in hardware or in software. The implementation can be carried out using a digital storage medium, for example a floppy disk, a DVD, a Blu-ray disc, a CD, a ROM, a PROM, an EPROM, an EEPROM or a FLASH memory, a hard disk or some other magnetic or optical storage unit, on which electronically readable control signals are stored which can interact or interact with a programmable computer system in such a way that the respective method is carried out. Therefore, the digital storage medium can be computer-readable. Some example embodiments according to the disclosure therefore comprise a data carrier having electronically readable control signals that are able to interact with a programmable computer system in such a way that one of the methods described herein is carried out.

Generally, example embodiments of the present disclosure can be implemented as a computer program product comprising a program code, wherein the program code is effective to the extent of carrying out one of the methods when the computer program product runs on a computer. The program code can, for example, also be stored on a machine-readable carrier.

Other example embodiments comprise the computer program for carrying out one of the methods described herein, wherein the computer program is stored on a machine-readable non-transitory carrier.

In other words, one example embodiment of the method according to the disclosure is therefore a computer program having a program code for carrying out one of the methods described herein when the computer program runs on a computer. A further example embodiment of the methods according to the disclosure is therefore a data carrier (or a digital storage medium or a computer-readable medium) on which the computer program for carrying out one of the methods described herein is recorded.

A further example embodiment of the method according to the disclosure is therefore a data stream or a sequence of signals which represents or represent the computer program for carrying out one of the methods described herein. The data stream or the sequence of signals can be conFig.d for example to the effect of being transferred via a data communication connection, for example via the Internet.

A further example embodiment comprises a processing unit, for example a computer or a programmable logic component, which is conFig.d or adapted to the effect of carrying out one of the methods described herein.

A further example embodiment comprises a computer on which the computer program for carrying out one of the methods described herein is installed.

In some example embodiments, a programmable logic component (for example a field programmable gate array, an FPGA) can be used to carry out some or all functionalities of the methods described herein. In some example embodiments, a field programmable gate array can interact with a microprocessor in order to carry out one of the methods described herein. Generally, the methods in some example embodiments are carried out on the part of an arbitrary hardware device. The latter can be universally usable hardware such as a computer processor (CPU) or hardware specific to the method, such as an ASIC, for example.

The example embodiments described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the following patent claims and not by the specific details that have been presented on the basis of the description and the explanation of the example embodiments herein.

The invention claimed is:

1. A device for generating a vector-modulated output signal based on a baseband signal having an in-phase component and a quadrature component, a first local oscillator (LO) signal for the in-phase component of the baseband signal and a second LO signal for the quadrature component of the baseband signal, comprising:
   a clock combination circuit configured to logically combine the first LO signal and the second LO signal in order to obtain a plurality of clock signals that each have a duty cycle of less than 50%, and wherein at every instant a maximum of one of the clock signals from the plurality of clock signals is active;
   a baseband combination circuit configured to combine the in-phase component and the quadrature component to obtain a plurality of combined IQ signals; and
   a plurality of mixer cells configured to generate the vector-modulated output signal based on the combined IQ signals, the first LO signal and the second LO signal, and the plurality of clock cycles, wherein the first LO signal for the in-phase component and the second LO signal for the quadrature component are phase shifted with respect to each other and at least one cell of the plurality of mixer cells receives the first LO signal and the second LO signal.

2. The device according to claim 1,
   wherein the baseband signal comprises a differential baseband signal comprising a differential in-phase component and a differential quadrature component; and
   wherein the baseband combination circuit is configured to add subcomponents of the differential in-phase component and subcomponents of the differential quadrature component to obtain the plurality of combined IQ signals.

3. The device according to claim 2,
   wherein the differential in-phase component has a first subcomponent and a second subcomponent and the differential quadrature component has a first subcomponent and a second subcomponent; and
   wherein the baseband combination circuit is configured to:
      add the first subcomponent of the differential in-phase component and the first subcomponent of the differential quadrature component in the context of a first addition in order to obtain a first combined IQ signal;
      add the second subcomponent of the differential in-phase component and the second subcomponent of the differential quadrature component in the context of a second addition in order to obtain a second combined IQ signal;
      add the second subcomponent of the differential in-phase component and the first subcomponent of the differential quadrature component in the context of a third addition in order to obtain a third combined IQ signal; and
      add the first subcomponent of the differential in-phase component and the second subcomponent of the differential quadrature component in the context of a fourth addition in order to obtain a fourth combined IQ signal.

4. The device according to claim 1, wherein each of the combined IQ signals has a plurality of single-bit signals, wherein a single-bit signal of a combined IQ signal forms or predefines a drive signal for one mixer cell from the plurality of mixer cells.

5. The device according to claim 4, wherein at least one first mixer cell from the plurality of mixer cells is configured to receive at least one drive signal for each of the combined IQ signals.

6. The device according to claim 5, wherein the first mixer cell is configured to receive a plurality of clock signals based on the first LO signal and the second LO signal and logically combine each of the received drive signals at least with one of the clock signals in order to obtain a current source drive signal for a current source of the mixer cell.

7. The device according to claim 6, wherein the first mixer cell is configured to impress a first current at a first output terminal of the mixer cell in response to a first state of the current source drive signal, and to impress no current at the first output terminal of the mixer cell in response to a second state of the current source drive signal.

8. The device according to claim 7, wherein the first mixer cell is configured to combine each received drive signal with another of the received clock signals in order furthermore to obtain a further current source drive signal for the current source, to impress a second current at a second output terminal of the mixer cell in response to a first state of the further current source drive signal and impress no current at the second output terminal in response to a second state of the further current source drive signal.

9. The device according to claim 1, wherein the clock combination circuit is configured to logically combine the first LO signal with the second LO signal such that the clock signals each have a duty cycle of 25% within a tolerance range of ±10% of a period of one of the clock signals.

10. The device according to claim 1,
wherein the first LO signal comprises a first differential LO signal having a first subcomponent and a second subcomponent, and the second LO signal comprises a second differential LO signal having a first subcomponent and a second subcomponent; and
wherein the device further comprises a clock combination circuit configured to:
logically combine the first subcomponent of the first LO signal with the first subcomponent of the second LO signal in order to obtain a first clock signal;
logically combine the second subcomponent of the first LO signal with the second subcomponent of the second LO signal in order to obtain a second clock signal;
logically combine the first subcomponent of the first LO signal with the second subcomponent of the second LO signal in order to obtain a third clock signal; and
logically combine the second subcomponent of the first LO signal with the first subcomponent of the second LO signal in order to obtain a fourth clock signal.

11. The device according to claim 10,
wherein the clock combination circuit is configured to subject at least the first subcomponent of the first LO signal and the first subcomponent of the second LO signal to a logical AND combination or to a logical NOR combination to obtain the first clock signal.

12. The device according to claim 1, further comprising a decoder configured to apply the plurality of clock signals to each of the plurality of mixer cells.

13. The device according to claim 1, wherein the mixer cells are configured to generate the vector-modulated output signal as a differential vector-modulated output signal having a first subcomponent and a second subcomponent;
wherein the mixer cells are configured to provide the differential vector-modulated output signal such that the first subcomponent thereof is based on a superposition of a plurality of first currents of the mixer cells and the second subcomponent thereof is based on a superposition of second currents of the mixer cells; and
wherein the baseband combination circuit is configured to combine the in-phase component and the quadrature component such that, apart from changeover instants, at every instant one mixer cell from the plurality of mixer cells provides maximally either a first current or a second current.

14. The device according to claim 1, wherein the baseband combination circuit is configured to:
obtain the first combined IQ signal based on a first logical combination of single-bit signals resulting from the first addition with single-bit signals resulting from the second addition;
obtain the second combined IQ signal based on a second logical combination of the single-bit signals resulting from the first addition with the single-bit signals resulting from the second addition;
obtain the third combined IQ signal base on a third logical combination of single-bit signals resulting from the third addition with single-bit signals resulting from the fourth addition; and
obtain the fourth combined IQ signal based on a fourth logical combination of single-bit signals resulting from the third addition with single-bit signals resulting from the fourth addition.

15. The device according to claim 14, wherein the baseband combination circuit is configured to carry out the logical combinations of the single-bit signals resulting from the additions such that only single-bit signals which have the same bit significance are logically combined with one another.

16. The device according to claim 14, wherein the baseband combination circuit is configured to:
logically AND the single-bit signals resulting from the first addition with negated versions of the single-bit signals resulting from the second addition in order to obtain the first combined IQ signal;
logically AND the single-bit signals resulting from the second addition with negated versions of the single-bit signals resulting from the first addition in order to obtain the second combined IQ signal;
logically AND the single-bit signals resulting from the third addition with negated versions of the single-bit signals resulting from the fourth addition in order to obtain the third combined IQ signal; and
logically AND the single-bit signals resulting from the fourth addition with negated versions of the single-bit signals resulting from the third addition in order to obtain the fourth combined IQ signal.

17. The device according to claim 1, further comprising a local oscillator circuit configured to provide the first LO signal for the in-phase component and the second LO signal for the quadrature component in such a way that the first LO signal and the second LO signal each have a duty ratio of 50% within a tolerance range of ±10% of a period of the first LO signal.

18. The device according to claim 1, wherein the baseband combination circuit is configured to carry out the combination of the in-phase component and the quadrature component into the digital domains in order to obtain the plurality of combined IQ signals as digital signals.

19. A device for generating a vector-modulated differential output signal based on a baseband signal having a differential in-phase component and a differential quadrature component, a first differential local oscillator (LO) signal for the in-phase component and a second differential LO signal for the quadrature component, wherein the first differential LO signal is phase-shifted with respect to the second differential LO signal, comprising:
a clock combination circuit configured to logically combine the first differential LO signal and the second differential LO signal in order to obtain a plurality of clock signals which each have a duty ratio of 25% within a tolerance range of ±10% of a period of one of the clock signals and are shifted with respect to one another in such a way that, apart from changeover instants, at every instant a maximum of one of the combined clock signals is active;
a baseband combination circuit configured to add together subcomponents of the in-phase component and subcomponents of the quadrature component and logically combine single-bit signals resulting from the additions with one another to obtain a plurality of combined IQ signals each having a plurality of single-bit signals; and
a plurality of mixer cells configured to provide, based on the clock signals and the single-bit signals of the combined IQ signals, a plurality of first currents and provide a plurality of second currents in such a way that a first subcomponent of the differential vector-modulated output signal is based on a superposition of the first currents of the mixer cells and a second subcomponent of the differential vector-modulated output signal is based on a superposition of the second currents of the mixer cells; and wherein the baseband combination circuit is configured to carry out the logical combinations of the single-bit signals resulting from the additions such that, apart from changeover instants, at every instant each mixer cell, based on the clock signals and the single-bit signals of the combined IQ signals, provides maximally either a first current or a second current.

* * * * *